US012718884B2

(12) United States Patent
Kim et al.

(10) Patent No.: US 12,718,884 B2
(45) Date of Patent: Aug. 25, 2026

(54) SEMICONDUCTOR MEMORY DEVICE AND OPERATING METHOD OF THE SAME

(71) Applicant: Samsung Electronics Co., Ltd., Suwon-si (KR)

(72) Inventors: Tae Young Kim, Suwon-si (KR); Dae Won Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 112 days.

(21) Appl. No.: 18/923,868

(22) Filed: Oct. 23, 2024

(65) Prior Publication Data

US 2025/0299737 A1 Sep. 25, 2025

(30) Foreign Application Priority Data

Mar. 21, 2024 (KR) ........................ 10-2024-0039037

(51) Int. Cl.

| | |
|---|---|
| ***G11C 16/34*** | (2006.01) |
| ***G11C 16/04*** | (2006.01) |
| ***G11C 16/08*** | (2006.01) |
| ***G11C 16/10*** | (2006.01) |

(Continued)

(52) U.S. Cl.

CPC .......... *G11C 16/10* (2013.01); *G11C 16/0483* (2013.01); *G11C 16/08* (2013.01); *G11C 16/14* (2013.01); *G11C 16/30* (2013.01); *G11C 16/3459* (2013.01)

(58) Field of Classification Search

CPC ..... G11C 16/10; G11C 16/0483; G11C 16/08; G11C 16/14; G11C 16/30; G11C 16/3459; G11C 11/223; G11C 11/2255; G11C 11/2257; G11C 11/2259; G11C 11/2275;

(Continued)

(56) References Cited

U.S. PATENT DOCUMENTS 8,223,556 B2 7/2012 Dutta et al.
8,456,907 B2 6/2013 Kim et al.
9,312,027 B2 4/2016 Choi et al.

(Continued)

FOREIGN PATENT DOCUMENTS

KR 10-2006-0107689 A 10/2006
KR 10-1080912 B1 11/2011

(Continued)

*Primary Examiner* — Michael T Tran

(74) *Attorney, Agent, or Firm* — Fish & Richardson P.C.

(57) ABSTRACT

A semiconductor memory device includes a substrate, first and second memory cell groups, a first word line connected to the first and second memory cell groups, and a control logic configured to cause the semiconductor memory device to apply a positive (+) erase voltage to the substrate, apply a positive (+) first program voltage to the first word line such that the first memory cell group has a first threshold voltage, apply a positive (+) first correction voltage to the first word line based on a determination that one or more first memory cells of the first memory cell group have respective threshold voltages smaller than the first verification voltage, and apply a negative (−) second correction voltage to the first word line based on a determination that one or more second memory cells of the first memory cell group have respective threshold voltages greater than the second verification voltage.

20 Claims, 21 Drawing Sheets

(51) Int. Cl.
*G11C 16/14* (2006.01)
*G11C 16/30* (2006.01)

(58) Field of Classification Search
CPC ............ G11C 11/2293; G11C 11/2277; G11C 11/2297
USPC ........................................ 365/185.22, 185.24
See application file for complete search history.

(56) References Cited

U.S. PATENT DOCUMENTS

| | | | | |
|---|---|---|---|---|
| 9,672,933 | B2 | 6/2017 | Kwon et al. | |
| 9,818,475 | B2 | 11/2017 | Jang et al. | |
| 2006/0120154 | A1 * | 6/2006 | Lee | G11C 29/50004 365/185.17 |
| 2008/0037307 | A1 * | 2/2008 | Goda | G11C 16/344 365/7 |
| 2011/0122692 | A1 | 5/2011 | Dutta et al. | |
| 2012/0170366 | A1 | 7/2012 | Kim et al. | |
| 2015/0003159 | A1 | 1/2015 | Choi et al. | |
| 2016/0042803 | A1 | 2/2016 | Kwon et al. | |
| 2016/0141025 | A1 | 5/2016 | Jang et al. | |
| 2019/0287625 | A1 * | 9/2019 | Hong | G11C 11/5635 |
| 2023/0410922 | A1 * | 12/2023 | Prakash | G11C 11/5671 |
| 2024/0320144 | A1 * | 9/2024 | Goda | G06F 12/0246 |
| 2024/0420775 | A1 * | 12/2024 | Chen | G11C 11/5642 |

FOREIGN PATENT DOCUMENTS

| | | | | |
|---|---|---|---|---|
| KR | 2012-0061565 | A | 6/2012 | |
| KR | 2016-0038642 | A | 4/2016 | |
| WO | WO-2023275632 | A1 * | 1/2023 | G06F 3/0679 |

* cited by examiner

SEMICONDUCTOR MEMORY DEVICE AND OPERATING METHOD OF THE SAME

CROSS-REFERENCE TO RELATED APPLICATION

This application claims priority from Korean Patent Application No. 10-2024-0039037 filed on Mar. 21, 2024 in the Korean Intellectual Property Office, and all the benefits accruing therefrom under 35 U.S.C. 119, the contents of which in its entirety are herein incorporated by reference.

BACKGROUND

1. Field

The present inventive concepts relate to semiconductor memory devices, and programming methods thereof. More specifically, the present inventive concepts relate to semiconductor memory devices including a ferroelectric-based data storage element, and programming methods thereof.

2. Description of the Related Art

As a semiconductor memory device capable of storing high-capacity data is required in an electronic system, schemes for increasing the data storage capacity of the semiconductor memory device are being researched. As one of schemes for increasing the data storage capacity of the semiconductor memory device, a semiconductor memory device including memory cells arranged three-dimensionally instead of memory cells arranged two-dimensionally has been proposed.

SUMMARY

Some example embodiments of the present inventive concepts provide a semiconductor memory device having improved performance and reliability.

Some example embodiments of the present inventive concepts provide a programming method of the semiconductor memory device having improved performance and reliability.

According to some example embodiments of the present inventive concepts, a semiconductor memory device may include a substrate, a memory cell array, a voltage generator, and a control logic. The memory cell array may include a plurality of memory cells that are each configured to store a plurality of bits, a plurality of word lines which are connected to the plurality of memory cells and extend in a first direction on the substrate, and a plurality of bit lines which are connected to the plurality of memory cells and extend in a second direction intersecting the first direction. The voltage generator may be configured to generate a voltage applied to the memory cell array. The control logic may be configured to control the voltage generator. The plurality of word lines may include a first word line. The plurality of memory cells may include a first memory cell group and a second memory cell group. The first word line may be connected to the first memory cell group and the second memory cell group. The control logic may be configured to control the voltage generator to cause the semiconductor memory device to apply an erase voltage to the substrate, the erase voltage is a positive (+) erase voltage, apply a first program voltage to the first word line such that the first memory cell group has a first threshold voltage, the first program voltage is a positive (+) first program voltage, determine whether respective threshold voltages of memory cells of the first memory cell group are equal to or greater than a first verification voltage, the first verification voltage smaller than the first threshold voltage, apply a first correction voltage to the first word line connected to one or more first memory cells of the first memory cell group to perform a first verification based on a determination that the one or more first memory cells have respective threshold voltages smaller than the first verification voltage, the first correction voltage is a positive (+) first correction voltage, determine whether respective threshold voltages of the memory cells of the first memory cell group are equal to or smaller than a second verification voltage, the second verification voltage greater than the first threshold voltage, and apply a second correction voltage to the first word line connected to one or more second memory cells of the first memory cell group to perform a second verification based on a determination that the one or more second memory cells have respective threshold voltages greater than the second verification voltage, the second correction voltage is a negative (−) second correction voltage.

According to some example embodiments of the present inventive concepts, there is provided a programming method of a semiconductor memory device. The semiconductor memory device may include a substrate. The semiconductor memory device may include a memory cell array which includes a plurality of memory cells, each memory cell configured to store a plurality of bits, a plurality of word lines connected to the plurality of memory cells and extending in a first direction on the substrate, and a plurality of bit lines connected to the plurality of memory cells and extending in a second direction intersecting the first direction. The semiconductor memory device may include a voltage generator configured to generate a voltage applied to the memory cell array. The semiconductor memory device may include a control logic configured to control the voltage generator. The word lines may include a first word line. The plurality of memory cells may include a first memory cell group. The first word line may be connected to the first memory cell group. The programming method may include applying an erase voltage to the substrate to perform an erase operation on a plurality of memory cells corresponding to the plurality of word lines, the erase voltage is a positive (+) erase voltage; performing a first program operation subsequently to performing the erase operation, the first program operation including applying a first program voltage to the first word line so that the first memory cell group has a first threshold voltage, the first program voltage is a positive (+) first program voltage; performing a first verification operation on the first memory cell group based on a first verification voltage subsequently to performing the first program operation, the first verification voltage smaller than the first threshold voltage; and performing a second verification operation on the first memory cell group based on a second verification voltage, the second verification voltage greater than the first threshold voltage.

According to some example embodiments of the present inventive concepts, there is provided a programming method of a semiconductor memory device. The semiconductor memory device may include a plurality of memory cells, a plurality of word lines connected to the plurality of memory cells and extending in a first direction on a substrate, a plurality of bit lines connected to the plurality of memory cells and extending in a second direction intersecting the first direction, and a control logic. The programming method may include applying an erase voltage to the substrate to perform an erase operation on the plurality of memory cells, the erase voltage is a positive (+) erase voltage; selecting a first word line among the plurality of word lines, the first word line connected to a first memory cell group and a second memory cell group among the plurality of memory cells; applying a first program voltage to the first word line so that the first memory cell group has a first threshold voltage, applying a bit line program voltage to a first bit line connected to the first memory cell group, and applying an inhibit voltage to a second bit line connected to the second memory cell group, the first program voltage is a positive (+) first program voltage; applying a first verification voltage to the first word line, the first verification voltage smaller than the first threshold voltage; applying a first correction voltage to the first word line, the first correction voltage is a positive (+) first correction voltage, the first correction voltage greater than the first program voltage; applying a second verification voltage to the first word line, the second verification voltage greater than the first threshold voltage; applying a second correction voltage to the first word line, the second correction voltage is a negative (−) second correction voltage, an absolute value of the second correction voltage equal to or smaller than an absolute value of the first correction voltage; applying a second program voltage to the first word line so that the second memory cell group has a second threshold voltage, applying the inhibit voltage to the first bit line, and applying the bit line program voltage to the second bit line, the second program voltage is a positive (+) second program voltage, the second threshold voltage greater than the first threshold voltage; applying a third verification voltage to the first word line, the third verification voltage smaller than the second threshold voltage; applying a third correction voltage to the first word line, the third correction voltage is a positive (+) third correction voltage, the third correction voltage greater than the second program voltage; applying a fourth verification voltage to the first word line, the fourth verification voltage greater than the second threshold voltage; and applying a fourth correction voltage to the first word line, the fourth correction voltage is a negative (−) fourth correction voltage, an absolute value of the fourth correction voltage equal to or smaller than an absolute value of the third correction voltage.

However, example embodiments of the present inventive concepts are not restricted to those set forth herein. The some example embodiments of the present inventive concepts will become more apparent to one of ordinary skill in the art to which the present inventive concepts pertain by referencing the detailed description of the present inventive concepts given below.

BRIEF DESCRIPTION OF THE DRAWINGS

The above and other aspects and features of the present inventive concepts will become more apparent by describing in detail example embodiments thereof with reference to the attached drawings, in which:

FIG. 3 is a schematic layout diagram for explaining a semiconductor memory device according to some example embodiments.

DETAILED DESCRIPTION

Figure 1:
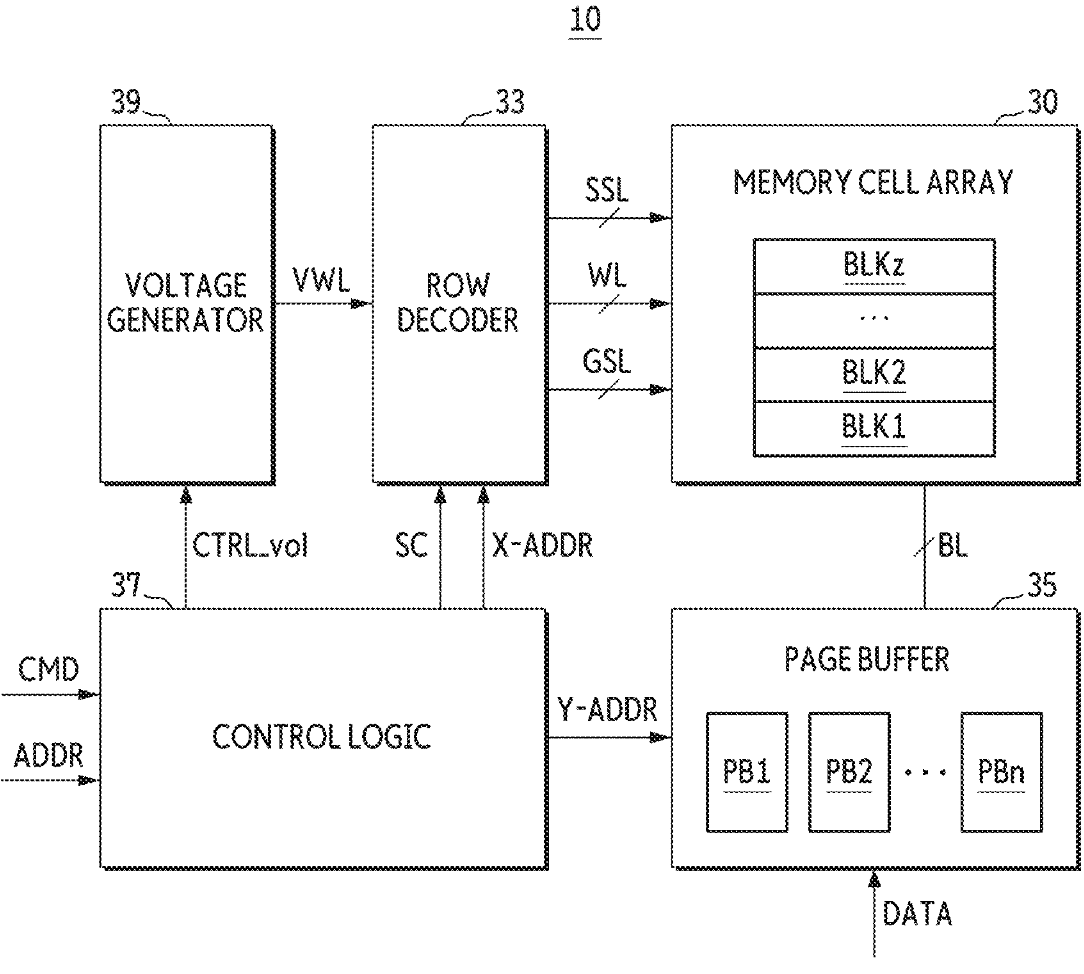
FIG. 1 is an example block diagram for explaining the semiconductor memory device according to some example embodiments.

Hereinafter, example embodiments of the present inventive concepts will be described clearly and in detail so that a person skilled in the art may easily implement the present inventive concepts. Although terms such as first and second are used to describe various elements or components in the present specification, it goes without saying that these elements or components are not limited by these terms. These terms are only used to distinguish a single element or component from other elements or components. Therefore, it goes without saying that a first element or component referred to below may be a second element or component within the technical idea of the present inventive concepts.

In order to clearly explain the present inventive concepts in the drawings, parts that are not related to the description are omitted, and similar parts are given similar reference numerals throughout the specification. In methods described with reference to the drawings, the order of operations of the methods may be changed, several operations may be merged, certain operations may be divided, and certain operations may not be performed.

Additionally, expressions written in the singular may be interpreted as singular or plural, unless explicit expressions such as "one" or "single" are used. Terms containing ordinal numbers, such as first, second, etc., may be used to describe various elements, but the elements are not limited by these terms. These terms may be used for the purpose of distinguishing one component from another.

Throughout the specification, the term "connected" does not mean only that two or more constituent components are directly connected, but may also mean that two or more constituent components are indirectly connected through another constituent component. In addition, unless explicitly described to the contrary, the word "comprise", and variations such as "comprises" or "comprising", will be understood to imply the inclusion of stated elements but not the exclusion of any other elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, when an element is referred to as being "above" or "on" a reference element, it can be positioned above or below the reference element, and it is not necessarily referred to as being positioned "above" or "on" in a direction opposite to gravity.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of ±10%).

It will be understood that elements and/or properties thereof may be recited herein as being "identical", "the same", or "equal" as other elements and/or properties thereof, and it will be further understood that elements and/or properties thereof recited herein as being "identical" to, "the same" as, or "equal" to other elements and/or properties thereof may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to, equal to or substantially equal to, and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element or property is referred to as being identical to, equal to, or the same as another element or property, it should be understood that the element or property is the same as another element or property within a desired manufacturing or operational tolerance range (e.g., ±10%).

It will be understood that elements and/or properties thereof described herein as being "substantially" the same, equal, and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

Hereinafter, semiconductor memory devices according to some example embodiments will be described with reference to FIGS. 1 to 21.

FIG. 1 is an example block diagram for explaining the semiconductor memory device according to some example embodiments.

Referring to FIG. 1, a semiconductor memory device 10 may include a memory cell array 30, a row decoder 33, a page buffer 35, a control logic 37, and a voltage generator 39. The semiconductor memory device 10 may further include a memory interface circuit, a column logic, a pre-decoder, a temperature sensor, a command decoder, an address decoder, and the like.

In some example embodiments, a memory cell array 30 may include a plurality of memory cell blocks BLK1 to BLKz (z being any positive integer). Each of the memory cell blocks BLK1 to BLKz may include a plurality of memory cells. The memory cell array 30 may be connected to a peripheral circuit through a bit line BL, a word line WL, at least one string selection line SSL, and at least one ground selection line GSL. Specifically, the memory cell blocks BLK1 to BLKz may be connected to the row decoder 33 through the word line WL, the string selection line SSL, and the ground selection line GSL. Also, the memory cell blocks BLK1 to BLKz may be connected to the page buffer 35 through the bit line BL.

The row decoder 33 may select at least one among a plurality of string selection line SSL, and may select at least one among a plurality of word lines WL in response to a row address X-ADDR. The row decoder 33 may connect the selected word line and the voltage generator 39 in response to a switch control signal SC. For example, the row decoder 33 may apply a program voltage and a program verification voltage to the selected word line at the time of a program operation, and may apply a read voltage to the selected word line at the time of a read operation.

The page buffer 35 may include a plurality of page buffers PB1 to PBn (n is an integer of 3 or more), and each of the plurality of page buffers PB1 to PBn may be connected to the memory cells through a plurality of bit lines BL. The page buffer 35 may select at least one among the bit lines BL in response to a column address Y-ADDR. The page buffer 35 may operate as a write driver or a sense amplifier depending on the operating mode. For example, at the time of the program operation, the page buffer 35 may apply a bit line voltage, which corresponds to data to be programmed, to the selected bit line. At the time of the read operation, the page buffer 35 may sense the current or voltage of the selected bit line to sense data stored in the memory cell.

The control logic 37 may generally control various operations inside the semiconductor memory device 10. The control logic 37 may output various control signals in response to command CMD and/or address ADDR from a memory interface circuit. For example, the control logic 37 may adjust the voltage levels to be provided to the word line WL and the bit line BL when performing the memory operation such as a program operation or an erase operation.

The voltage generator 39 may generate various types of voltages for performing program, read, and erase operations on the basis of the voltage control signal CTRL_vol. The control logic 37 may be configured to control the voltage generator 39, for example to control the voltage levels of the voltages that may be generated by the voltage generator 39, for example based on generating and transmitting the voltage control signal CTRL_vol to the voltage generator 39. For example, the voltage generator 39 may generate a program voltage, a read voltage, a program verification voltage, an erase voltage, and the like as the word line voltage VWL.

Figure 2:
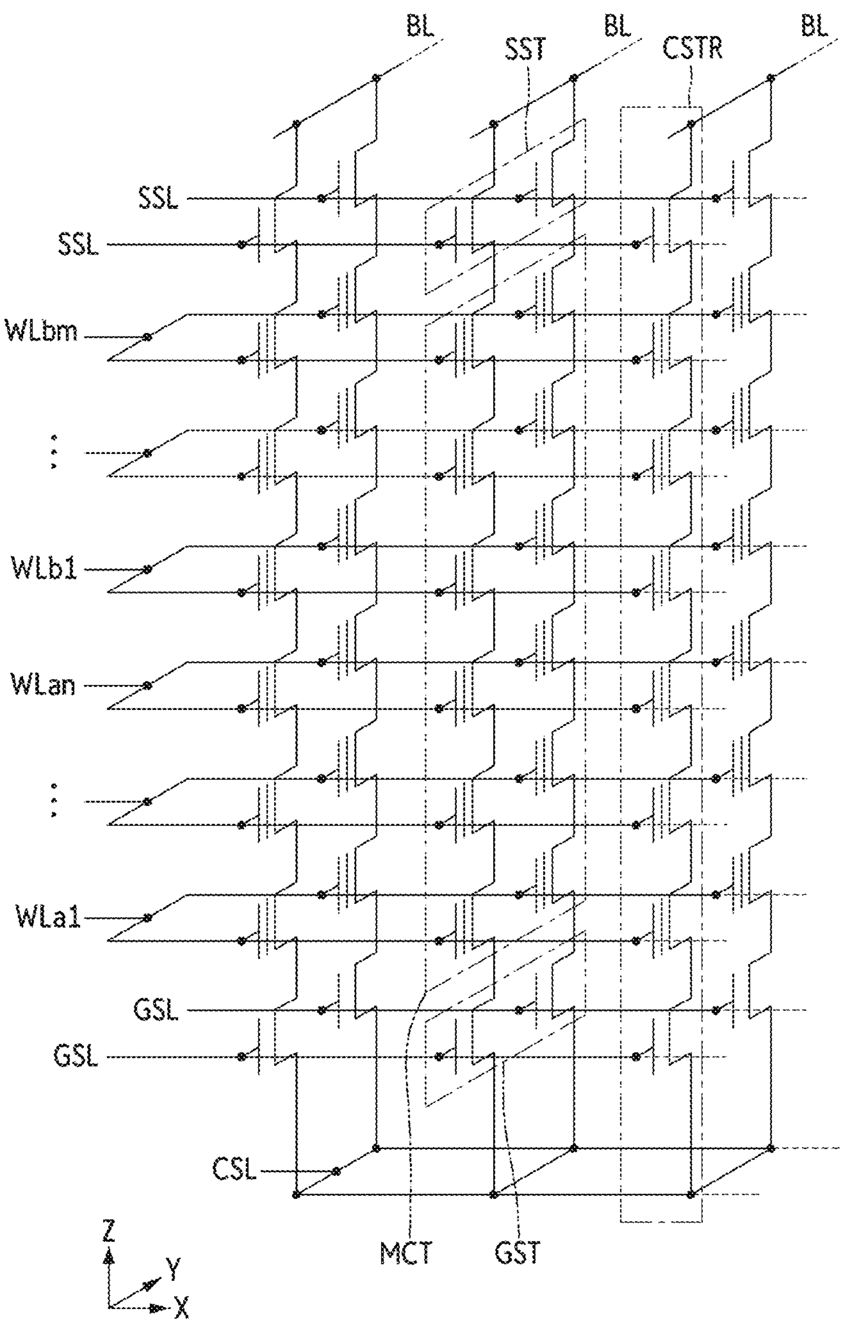
FIG. 2 is an example circuit diagram for explaining a semiconductor memory device according to some example embodiments.

FIG. 2 is an example circuit diagram for explaining a semiconductor memory device according to some example embodiments.

Referring to FIG. 2, a memory cell array (e.g., 30 of FIG. 1) of the semiconductor memory device according to some example embodiments includes a common source line CSL, a plurality of bit lines BL, and a plurality of cell strings CSTR.

The plurality of bit lines BL may be arranged two-dimensionally in a plane including a first direction X and a second direction Y. For example, the bit lines BL each extend in the second direction Y, may be spaced apart from each other, and may be arranged along the first direction X. A plurality of cell strings CSTR may be connected in parallel to each bit line BL. The cell strings CSTR may be commonly connected to the common source line CSL. That is, a plurality of cell strings CSTR may be disposed between the bit lines BL and the common source line CSL.

Each cell string CSTR may include a ground selection transistor GST connected to the common source line CSL, a string selection transistor SST connected to the bit line BL, and a plurality of memory cell transistors MCT disposed between the ground selection transistor GST and the string selection transistor SST. Each memory cell transistor MCT may include a data storage element. The ground selection transistor GST, the string selection transistor SST, and the memory cell transistors MCT may be connected in series in a vertical direction (hereinafter, a third direction Z) that intersects the first direction X and the second direction Y.

The common source line CSL may be commonly connected to the sources of the ground selection transistors GST. Also, the ground selection line GSL, the plurality of word lines WLa1 to WLan and WLb1 to WLbm (n and m may each independently be any positive integer), and the string selection line SSL may be disposed between the common source line CSL and the bit line BL. The ground selection line GSL may be used as a gate electrode of the ground selection transistor GST, the word lines WLa1 to WLan and WLb1 to WLbm may be used as the gate electrodes of the memory cell transistors MCT, and the string selection line SSL may be used as the gate electrode of the string selection transistor SST.

Figure 3:
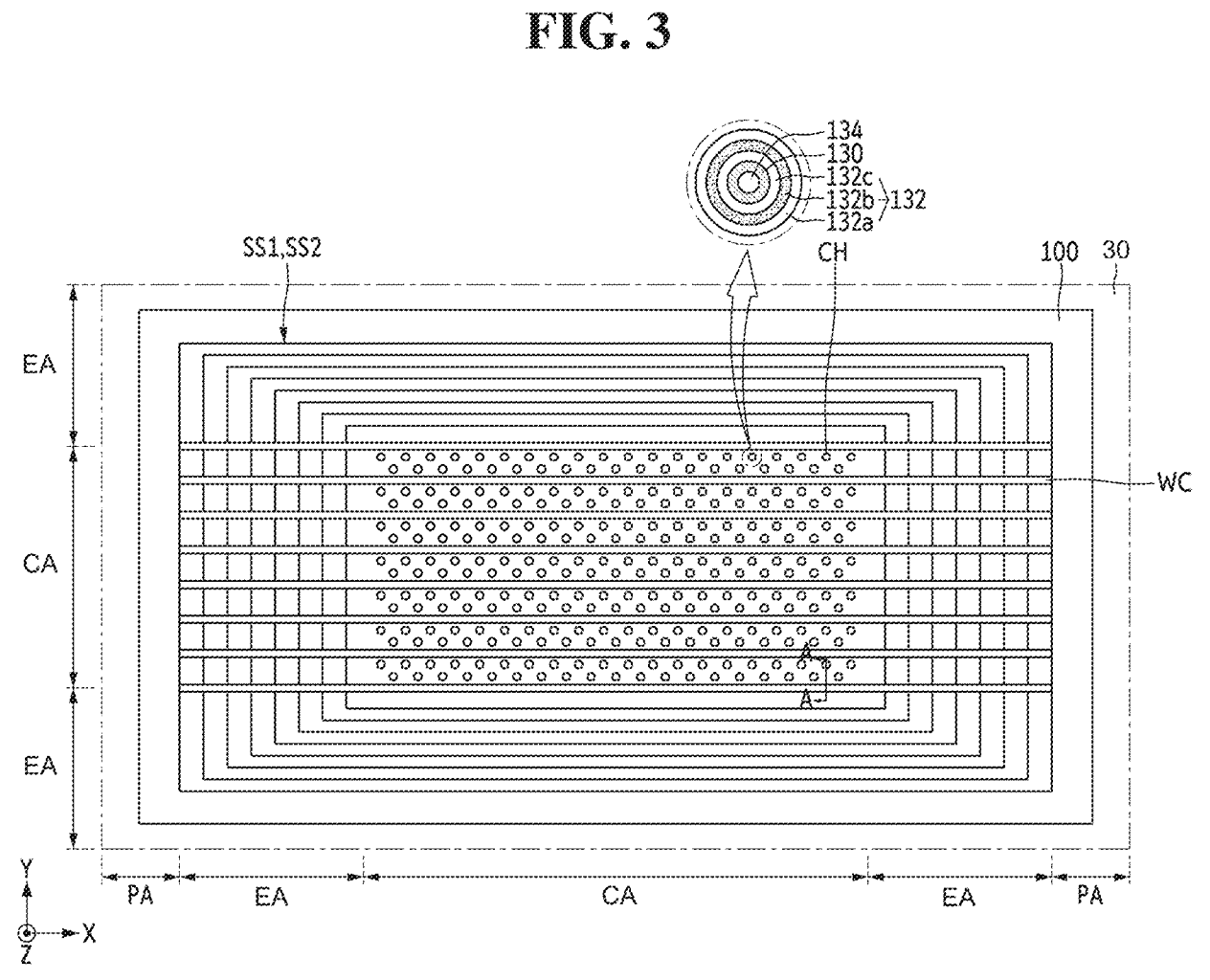
Figure 4:
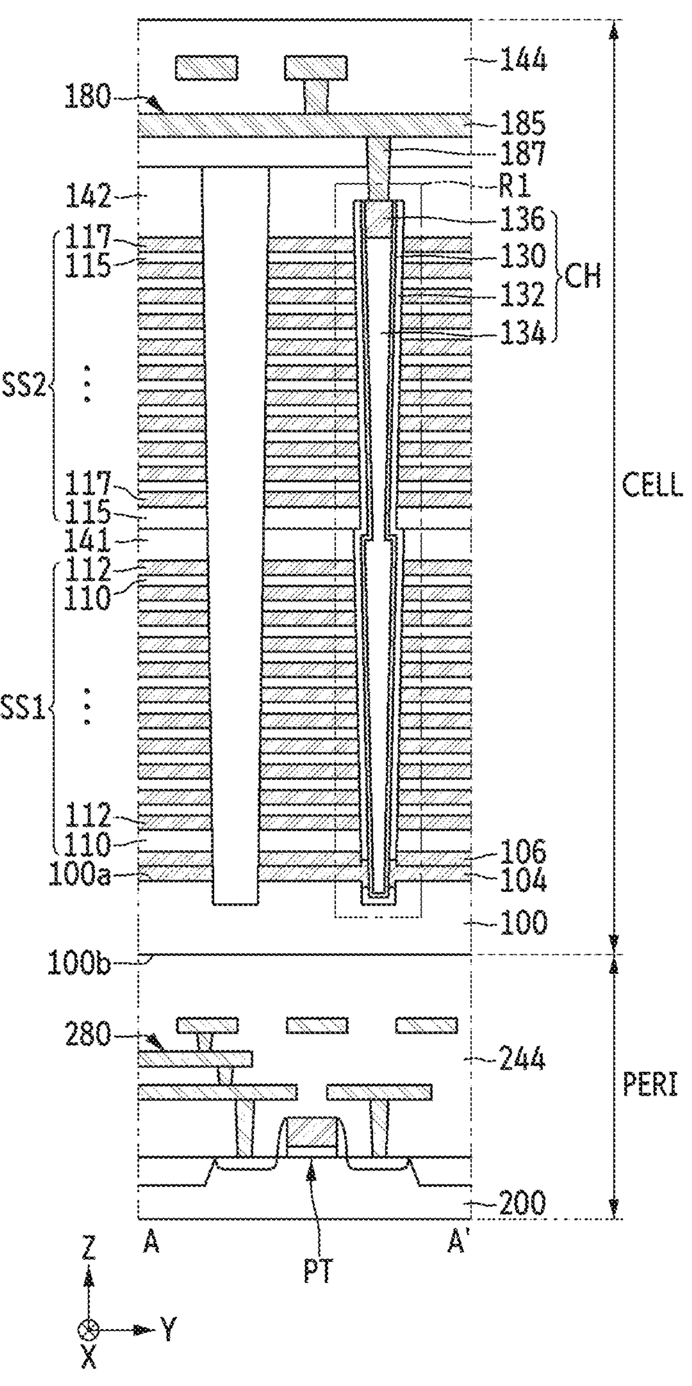
FIG. 4 is a cross-sectional view taken along line A-A' of FIG. 3.
Figure 5:
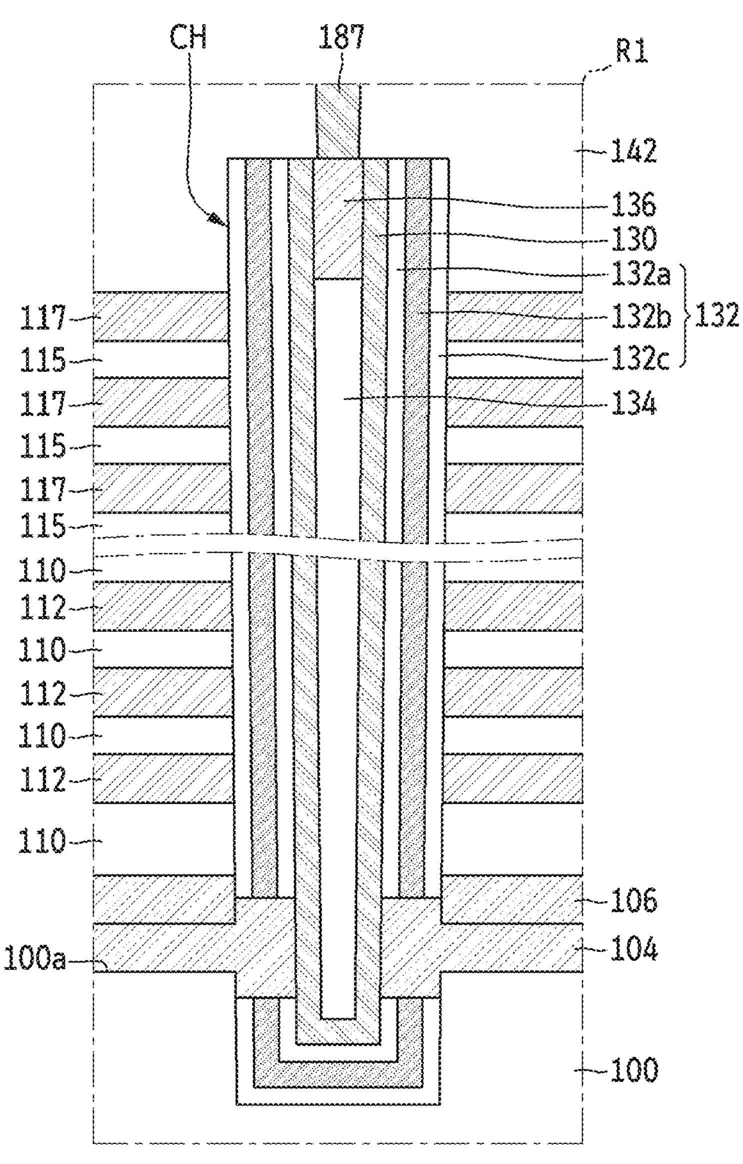
FIG. 5 is an enlarged view of a region R1 of FIG. 4 according to some example embodiments.

FIG. 3 is a schematic layout diagram for explaining a semiconductor memory device according to some example embodiments. FIG. 4 is a cross-sectional view taken along line A-A' of FIG. 3 according to some example embodiments. FIG. 5 is an enlarged view of a region R1 of FIG. 4 according to some example embodiments.

The memory cell structure CELL may include a cell array region CA, an extension region EA, and an external region PA.

A memory cell array (e.g., 30 of FIG. 1) including a plurality of memory cells may be formed in the cell array region CA. For example, a source layer 104, gate electrodes 112 and 117, a channel structure CH, a conductive line 185, and the like, which will be described below, may be disposed in the cell array region CA.

The extension region EA may be disposed around the cell array region CA. For example, the extension region EA may be adjacent to the cell array region CA in the first direction X. The gate electrodes 112 and 117, which will be described below, may be stacked in the extension region EA in a stepped shape.

The external region PA may be a peripheral region that surrounds the cell array region CA and the extension region EA. For example, the external region PA may be adjacent to the cell array region CA and/or the extension region EA in the first direction X and/or the second direction Y.

The memory cell structure CELL may include a first substrate 100, stacked structures SS1 and SS2, interlayer insulating films 141 and 142, a channel structure CH, a cutting pattern WC, and a first wiring structure 180.

The first substrate 100 may include, for example, a semiconductor substrate, such as a silicon substrate, a germanium substrate or a silicon-germanium substrate. Alternatively, the first substrate 100 may include a silicon-on-insulator (SOI) substrate, a germanium-on-insulator (GOI) substrate, or the like.

The first substrate 100 may include a first side 100*a* and a second side 100*b* that are opposite to each other. The first side 100*a* and the second side 100*b* may each extend along a horizontal plane (e.g., an XY plane). In the following description, the first side 100*a* may also be referred to as a front side of the first substrate 100, and the second side 100*b* may also be referred to as a back side of the first substrate 100.

The stacked structures SS1 and SS2 may be disposed inside the cell array region CA and the extension region EA. The stacked structures SS1 and SS2 may be formed on the first side 100*a* of the first substrate 100. The stacked structures SS1 and SS2 may include a plurality of mold insulating films 110 and 115 and a plurality of gate electrodes 112 and 117 that are stacked on the first substrate 100. Each of the mold insulating films 110 and 115 and each of the gate electrodes 112 and 117 may have a layered structure extending along a horizontal plane (e.g., an XY plane). The gate electrodes 112 and 117 may be spaced apart from each other by the mold insulating films 110 and 115 and stacked one after another.

In some example embodiments, the stacked structures SS1 and SS2 may include a plurality of gate stacks (e.g., a first gate stack SS1 and a second gate stack SS2) that are stacked sequentially on the first substrate 100. Although the number of stacks stacked on the first substrate 100 is only shown as being two, this is only an example, and the number of gate stacks stacked on the first substrate 100 may, of course, be three or more.

The first gate stack SS1 may include first mold insulating films 110 and first gate electrodes 112 that are alternately stacked on the first substrate 100. In some example embodiments, the first gate electrodes 112 may include at least one ground selection line (e.g., GSL of FIG. 2) and a plurality of first word lines (e.g., WLa1 to WLan of FIG. 2) that are stacked sequentially on the first substrate 100. The number, shape, and the like of the first mold insulating films 110 and the first gate electrodes 112 are merely example, and are not limited to those shown.

The second gate stack SS2 may include second mold insulating films 115 and second gate electrodes 117, which are alternately stacked on the first gate stack SS1. In some example embodiments, the second gate electrodes 117 may include a plurality of second word lines (e.g., WLb1 to WLbm of FIG. 2) and at least one string selection line (e.g., SSL of FIG. 2) that are stacked sequentially on the first gate stack SS1. The number, shape, and the like of the second mold insulating films 115 and the second gate electrodes 117 are merely examples, and are not limited to those shown.

The gate electrodes 112 and 117 may each include a conductive material, for example, but not limited to, a metal such as tungsten (W), molybdenum (Mo), ruthenium (Ru), cobalt (Co), or nickel (Ni), or a semiconductor material such as silicon. As an example, the gate electrodes 112 and 117 may each include at least one of tungsten (W), molybdenum (Mo), and ruthenium (Ru). As another example, the gate electrodes 112 and 117 may each include polysilicon.

In some example embodiments, each of the gate electrodes 112 and 117 may include a barrier metal film and a filling metal film that are stacked in sequence. The barrier metal film may include, for example, a metal nitride film such as titanium nitride (TiN). The filling metal film may fill the regions of the gate electrode 112 and 117 that remain after the barrier metal film is filled.

Each of the mold insulating films 110 and 115 may include, for example, but not limited to, at least one of silicon oxide, silicon nitride, or silicon oxynitride. As an example, the mold insulating films 110 and 115 may each include a silicon oxide film.

The interlayer insulating films 141 and 142 may be formed on the first side 100*a* of the first substrate 100 to cover the stacked structures SS1 and SS2. For example, the first interlayer insulating film 141 may be formed on the first substrate 100 to cover the first gate stack SS1, and the second interlayer insulating film 142 may be formed on the first interlayer insulating film 141 to cover the second gate stack SS2. The interlayer insulating films 141 and 142 may include, for example, but not limited to, at least one of silicon oxide, silicon oxynitride, and a low-k material having a dielectric constant lower than that of silicon oxide.

The channel structure CH may be disposed inside the cell array region CA. The channel structure CH may extend in the vertical direction (e.g., a third direction Z extending perpendicular to the first side 100*a* and/or the second side 100*b*) and intersect the plurality of gate electrodes 112 and 117. For example, the channel structure CH may extend in the third direction Z and penetrate the stacked structures SS1 and SS2. The channel structure CH may be a pillar (e.g., cylindrical) structure extending in the third direction Z.

In some example embodiments, the plurality of channel structures CH may be arranged in the form of a zigzag. For example, as shown in FIG. 3, the channel structures CH may be arranged alternately in the first direction X and the second direction Y. Such channel structures CH may further improve the degree of integration of the semiconductor memory device. The number, placement, and the like of the channel structures CH are merely example and are not limited to those shown.

In some example embodiments, each channel structure CH may have a step between the first gate stack SS1 and the second gate stack SS2. For example, as shown in FIG. 4, the side face of each channel structure CH may have a bending portion at a boundary between the first interlayer insulating film 141 and the second gate stack SS2.

The channel structure CH may include a channel pattern 130 and a data storage pattern 132.

The channel pattern 130 may extend in the third direction Z and intersect the plurality of gate electrodes 112 and 117. Although the channel pattern 130 is only shown to have a cup shape, this is only an example. For example, the channel pattern 130 may have various shapes such as a cylindrical shape, a square tube shape, and a solid filler shape. The channel pattern 130 may include semiconductor materials such as, but not limited to, single crystal silicon, polycrystalline silicon, organic semiconductor substance, and carbon nanostructure.

The data storage pattern 132 may be interposed between the channel pattern 130 and the plurality of gate electrodes 112 and 117. For example, the data storage pattern 132 may extend conformally along the profile of the outer side face of the channel pattern 130.

The data storage pattern 132 may include ferroelectrics. The ferroelectrics have polarization, a direction of polarization may change by an external electric field, and the ferroelectrics may have remnant polarization due to a dipole even in the absence of an external electric field. Each memory cell may store data, by using the polarization state of the data storage pattern 132.

In some example embodiments, the data storage pattern 132 may include a first insulating film 132*a*, a ferroelectric film 132*b*, and a second insulating film 132*c*, which are sequentially stacked on the outer side face of the channel pattern 130.

The first insulating film 132*a* may be interposed between the channel pattern 130 and the ferroelectric film 132*b*. For example, the first insulating film 132*a* may conformally extend along the profile of the outer side face of the channel pattern 130. The first insulating film 132*a* may include, for example, at least one of silicon oxide, silicon nitride, silicon oxynitride, or a high dielectric constant material having a higher dielectric constant than silicon oxide (e.g., aluminum oxide ($Al_2O_3$) or hafnium oxide ($HfO_2$)) and combinations thereof. As an example, the first insulating film 132*a* may include a silicon oxide film. In some example embodiments, the first insulating film 132*a* may be omitted.

The ferroelectric film 132*b* may be interposed between the first insulating film 132*a* and the second insulating film 132*c*. For example, the ferroelectric film 132*b* may extend conformally along the profile of the outer side face of the first insulating film 132*a*. The ferroelectric film 132*b* may include, for example, but not limited to, at least one of hafnium oxide, zirconium oxide, yttrium-doped zirconium oxide, yttrium-doped hafnium oxide, magnesium-doped zirconium oxide, magnesium-doped hafnium oxide, silicon-doped hafnium oxide, silicon-doped zirconium oxide, barium-doped titanium oxide, or combinations thereof.

The second insulating film 132*c* may be interposed between the ferroelectric film 132*b* and the gate electrodes 112 and 117. For example, the second insulating film 132*c* may extend conformally along the profile of the outer side face of the ferroelectric film 132*b*. The second insulating film 132*c* may include, for example, at least one of silicon oxide, silicon nitride, silicon oxynitride, a high dielectric constant material having a higher dielectric constant than silicon oxide (e.g., aluminum oxide ($Al_2O_3$) or hafnium oxide ($HfO_2$)), and combinations thereof. As an example, the second insulating film 132*c* may include a silicon oxide film. In some example embodiments, the second insulating film 132*c* may be omitted.

In some example embodiments, the channel structure CH may further include a filling insulating film 134. The filling insulating film 134 may be formed to fill the inside of the cup-shaped channel pattern 130. The filling insulating film 134 may include an insulating material, for example, but not limited to, silicon oxide.

In some example embodiments, the channel structure CH may further include a channel pad 136. The channel pad 136 may be formed to be connected to one end (e.g., the upper end) of the channel pattern 130. The channel pad 136 may include a conductive material, for example, but not limited to, impurity-doped polysilicon, metal, metal silicide or the like. As an example, the channel pad 136 may include a polysilicon film doped with an N-type impurity (e.g., phosphorus (P) or arsenic (As)).

In some example embodiments, a source layer 104 and a source support layer 106 may be formed between the first substrate 100 and the stacked structures SS1 and SS2.

The source layer 104 may extend along the first side 100*a* of the first substrate 100. The source layer 104 may be electrically connected to the channel pattern 130. For example, the source layer 104 may penetrate the data storage pattern 132 and may be in contact with the side faces of the channel pattern 130.

The source layer 104 may include a conductive material, for example, but not limited to, impurity-doped polysilicon or metal. As an example, the source layer 104 may include a polysilicon film doped with an N-type impurity (e.g., phosphorus (P) or arsenic (As)). The first substrate 100 and the source layer 104 may be provided as a common source line (e.g., CSL of FIG. 2) of the semiconductor memory device according to some example embodiments.

The source support layer 106 may be formed on the first substrate 100 and the source layer 104. For example, the source support layer 106 may extend along the upper face of the source layer 104. The source support layer 106 may be used as a support for preventing the mold stack from collapsing or falling in a replacement process for forming the source layer 104. The source support layer 106 may include, for example, but not limited to, a polysilicon film. In some example embodiments, the first substrate 100, the source layer 104, and the source support layer 106 may be provided as a common source line (e.g., CSL of FIG. 2) of the semiconductor memory device.

The cutting pattern WC may be formed over the cell array region CA and the extension region EA. The cutting pattern WC may extend long in the first direction X to cut the stacked structures SS1 and SS2. Further, the plurality of cutting patterns WC each extend in the first direction X, are spaced apart from each other, and may be arranged along the second direction Y. The stacked structures SS1 and SS2 may be divided by the plurality of cutting patterns WC to form a plurality of memory cell blocks (e.g., BLK1 to BLKz of FIG. 1). For example, two adjacent cutting patterns WC may define one memory cell block between them. A plurality of channel structures CH may be disposed inside each memory cell block defined by the cutting patterns WC.

In some example embodiments, the cutting pattern WC may include an insulating material, for example, but not limited to, at least one of silicon oxide, silicon nitride, and/or silicon oxynitride. As an example, the cutting pattern WC may include a silicon oxide film.

The first wiring structure 180 may be formed on the second interlayer insulating film 142. The first wiring structure 180 may be electrically connected to the source layer 104, the gate electrodes 112 and 117, and/or the channel structure CH. For example, a first inter-wiring insulating film 144 may be formed on the second interlayer insulating film 142. The first wiring structure 180 is formed inside the first inter-wiring insulating film 144, and may be connected to the source layer 104, the gate electrodes 112 and 117, and/or the channel structure CH. The number of layers, placement, and the like of the first wiring structure 180 are merely examples, and are not limited to those shown.

The first wiring structure 180 may include a conductive material, for example, but not limited to, at least one of aluminum (Al), copper (Cu), tungsten (W), molybdenum (Mo), cobalt (Co), ruthenium (Ru), or an alloy thereof.

In some example embodiments, the first wiring structure 180 may include a conductive line 185 disposed inside the cell array region CA. The conductive line 185 may extend long in the second direction Y. Furthermore, the plurality of conductive lines 185 each extend in the second direction Y, are spaced apart from each other, and may be arranged along the first direction X.

The conductive line 185 may be electrically connected to the plurality of channel structures CH arranged along the second direction Y. For example, a channel contact 187 that extends in the third direction Z to connect the channel pad 136 and the conductive line 185 may be formed. The conductive line 185 may be connected to one end (e.g., the upper end) of the channel pattern 130 through the channel contact 187 and the channel pad 136. Such a conductive line 185 may be provided as a bit line (e.g., BL of FIG. 2) of the semiconductor memory device according to some example embodiments.

A peripheral circuit structure PERI may include a second substrate 200, a peripheral circuit element PT, and a second wiring structure 280.

The second substrate 200 may include, for example, a semiconductor substrate, such as a silicon substrate, a germanium substrate or a silicon-germanium substrate. Alternatively, the second substrate 200 may include a silicon-on-insulator (SOI) substrate, a germanium-on-insulator (GOI) substrate, or the like.

The peripheral circuit element PT may be formed on the second substrate 200. The peripheral circuit element PT may constitute peripheral circuits (e.g., 33, 35, 37, and 39 of FIG. 1) that control the operation of the semiconductor memory device. For example, the peripheral circuit element PT may include a control circuit (e.g., 37 of FIG. 1), a row decoder (e.g., 33 of FIG. 1), a page buffer (e.g., 35 of FIG. 1), and the like. In the following description, a surface of the second substrate 200 on which the peripheral circuit elements PT are disposed may also be referred to as a front side of the second substrate 200. In contrast, a surface of the second substrate 200 opposite to the front side of the second substrate 200 may also be referred to as a back side of the second substrate 200.

The peripheral circuit element PT may include, for example, but not limited to, a transistor. For example, the peripheral circuit element PT include not only various active elements such as a transistor, but also various passive elements such as a capacitor, a resistor, and an inductor.

The second wiring structure 280 may be formed on the peripheral circuit element PT. For example, a second inter-wiring insulating film 244 may be formed on the front side of the second substrate 200. The second wiring structure 280 is formed inside the second inter-wiring insulating film 244, and may be electrically connected to the peripheral circuit element PT. The number of layers, placement, and the like of the shown second wiring structure 280 are merely examples, and are not limited those shown.

In some example embodiments, the memory cell structure CELL may be stacked on the peripheral circuit structure PERI. For example, the memory cell structure CELL may be stacked on the second inter-wiring insulating film 244.

In some example embodiments, the second side 100*b* of the first substrate 100 may be opposite to the peripheral circuit structure PERI. For example, the first substrate 100 may be interposed between the stacked structures SS1 and SS2 and the peripheral circuit structure PERI.

Figure 6:
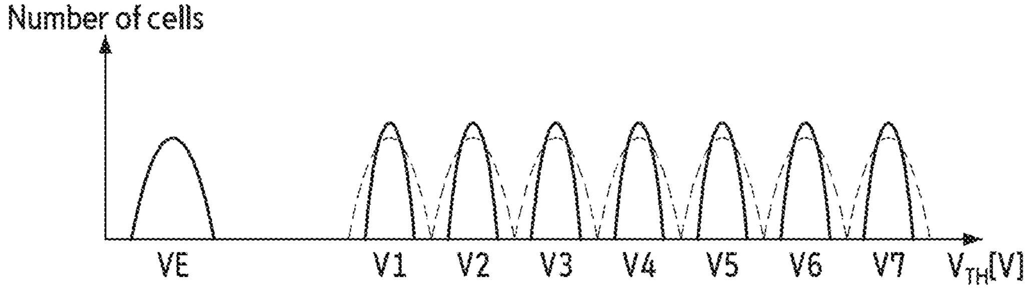
FIG. 6 is a graph for explaining a threshold voltage distribution of a semiconductor memory device according to some example embodiments.

FIG. 6 is a graph for explaining a threshold voltage distribution of a semiconductor memory device according to some example embodiments.

Referring to FIG. 6, each of the plurality of memory cells included in the semiconductor memory device 10 according to some example embodiments may store a plurality of bits. For example, each of the memory cells included in the semiconductor memory device 10 may be a TLC (Triple Level Cell) that stores three bits.

The memory cells of an erased state having an erase threshold voltage VE on one word line may be brought into one program state having a first threshold voltage V1 to a seventh threshold voltage V7 by the program operation.

For example, among a plurality of memory cells connected to one word line, a first memory cell group may be set to have the first threshold voltage V1, and a second memory cell group may be set to have the second threshold voltage V2.

The distribution of the threshold voltages of the plurality of memory cells after the program operation may be in a state in which the distribution of each program state overlaps, as shown by a dotted line.

Therefore, by the verification operation after the program operation, the distribution width of the threshold voltages of the plurality of memory cells may be formed to be narrow, as shown by the solid line. By forming the narrow distribution width of the plurality of memory cells having respective threshold voltages, each program state may be clearly distinguished, thereby providing a semiconductor memory device 10 having improved performance and reliability.

Although only a case where the memory cells included in the semiconductor memory device 10 are TLCs has been described for convenience of explanation, example embodiments of the present inventive concepts are not limited thereto. For example, it goes without saying that the memory cells included in the semiconductor memory device 10 according to some example embodiments may be a QLC (Quadruple Level Cell).

Figure 7:
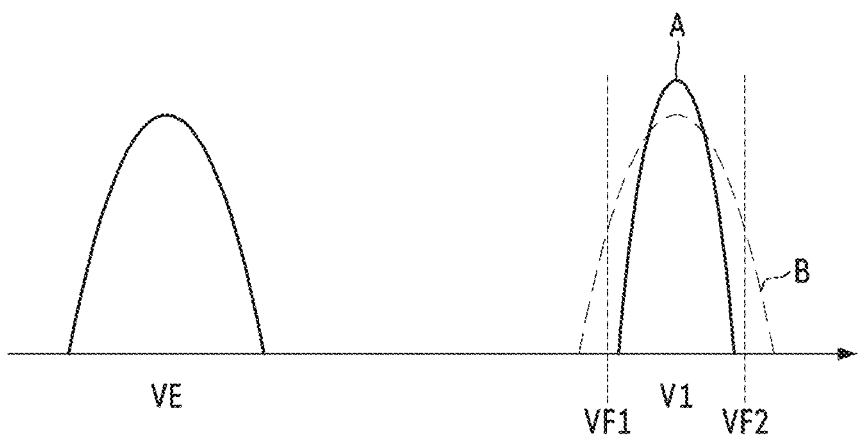
FIG. 7 is a graph for explaining program and verification operations of the semiconductor memory device according to some example embodiments.
Figure 8:
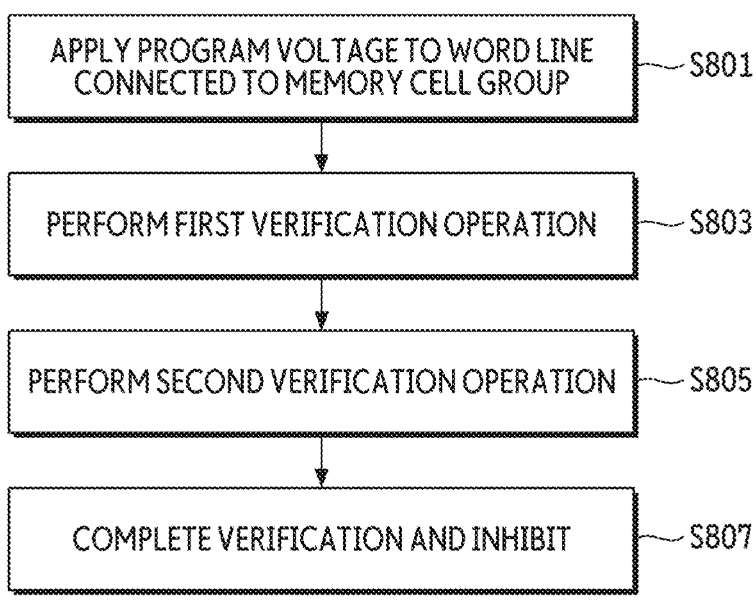
FIG. 8 is a flowchart for explaining the program and verification operations of the semiconductor memory device according to some example embodiments.

FIG. 7 is a graph for explaining program and verification operations of the semiconductor memory device according to some example embodiments. FIG. 8 is a flowchart for explaining the program and verification operations of the semiconductor memory device according to some example embodiments. The operations shown in FIG. 8 may be performed based on the control logic 37 controlling at least the voltage generator 39. For example, the control logic 37 may be configured to control at least the voltage generator 39 (e.g., based on generating one or more voltage control signals CTRL_vol) to perform (e.g., to cause the semiconductor memory device 10 to perform) any of the operations of the methods shown in FIG. 8.

Referring to FIGS. 7 and 8, when the plurality of memory cells connected to the first word line are all in an erase state having an erase threshold voltage VE, a first program voltage (VPGM1 of FIG. 11) is applied to the first word line (S801). Accordingly, the program operation which causes the first memory cell group to have the first threshold voltage V1 may be performed. Specifically, the first program voltage may be applied to the first word line connected to the first memory cell group. Further, a bit line program voltage may be applied to the bit line connected to the first memory cell group. An inhibit voltage may be applied to the bit line connected to a second memory cell group different from the first memory cell group.

After the program operation is performed, the distribution of threshold voltages of the memory cells included in the first memory cell group may appear as in a pre-verification state B indicated by a dotted line.

Thereafter, a first verification operation that is performed by a first verification voltage VF1 lower than the first threshold voltage V1 may be performed on the first memory cell group of the pre-verification state B (S803). For example, the first verification voltage VF1 may be applied to the first word line connected to the first memory cell group to verify whether the threshold voltage of the memory cells included in the first memory cell group (e.g., respective threshold voltages of the plurality of memory cells of the first memory cell group) is equal to or greater than the first verification voltage VF1. Then, a positive correction voltage (e.g., a first correction voltage that is a positive (+) first correction voltage) may be applied to the memory cells having a threshold voltage less than the first verification voltage VF1, among the memory cells included in the first memory cell group. Such memory cells having a threshold voltage less than (e.g., smaller than) the first verification voltage VF1, among the memory cells included in the first memory cell group, may be referred to as one or more first memory cells of the plurality of memory cells of the first memory cell group, and the positive (+) first correction voltage may be applied to the first word line connected to the one or more first memory cells. The positive correction voltage may be greater (e.g., greater in absolute magnitude) than the first program voltage. A specific explanation of the first verification operation will be given later.

Next (e.g., subsequently to performing the first verification operation), a second verification operation that is performed by a second verification voltage VF2 greater than the first threshold voltage V1 may be performed on the first memory cell group (S805). For example, the second verification voltage VF2 may be applied to the first word line connected to the first memory cell group to verify whether the threshold voltage of the memory cells included in the first memory cell group (e.g., respective threshold voltages of the plurality of memory cells of the first memory cell group) is equal to or less than the second verification voltage VF2. Further, a negative correction voltage may be applied to the memory cells having a threshold voltage exceeding the second verification voltage VF2, among the memory cells included in the first memory cell group. Such memory cells having a threshold voltage exceeding (e.g., greater than) the second verification voltage VF2, among the memory cells included in the first memory cell group, may be referred to as one or more second memory cells of the plurality of memory cells of the first memory cell group, and the negative correction voltage may be applied to the first word line connected to the one or more second memory cells. The one or more second memory cells and the one or more first memory cells may include at least one same (common) memory cell, but example embodiments are not limited thereto. The negative correction voltage may be a negative (−) voltage that is smaller than or equal to an absolute value of the positive correction voltage. The negative correction voltage may be referred to as a second correction voltage that is a negative (−) second correction voltage. A specific explanation of the second verification operation will be given later.

The inhibit voltage may be applied to the first memory cell group at which the first verification and second verification operations have been completed (S807).

After the first verification and second verification operations are performed, the distribution of the threshold voltages of the memory cells included in the first memory cell group may appear as in a post-verification state A shown by a solid line.

By forming a narrow distribution width of the plurality of memory cells having respective threshold voltages, each program state may be clearly distinguished, thereby providing a semiconductor memory device 10 having improved performance and reliability.

Figure 9:
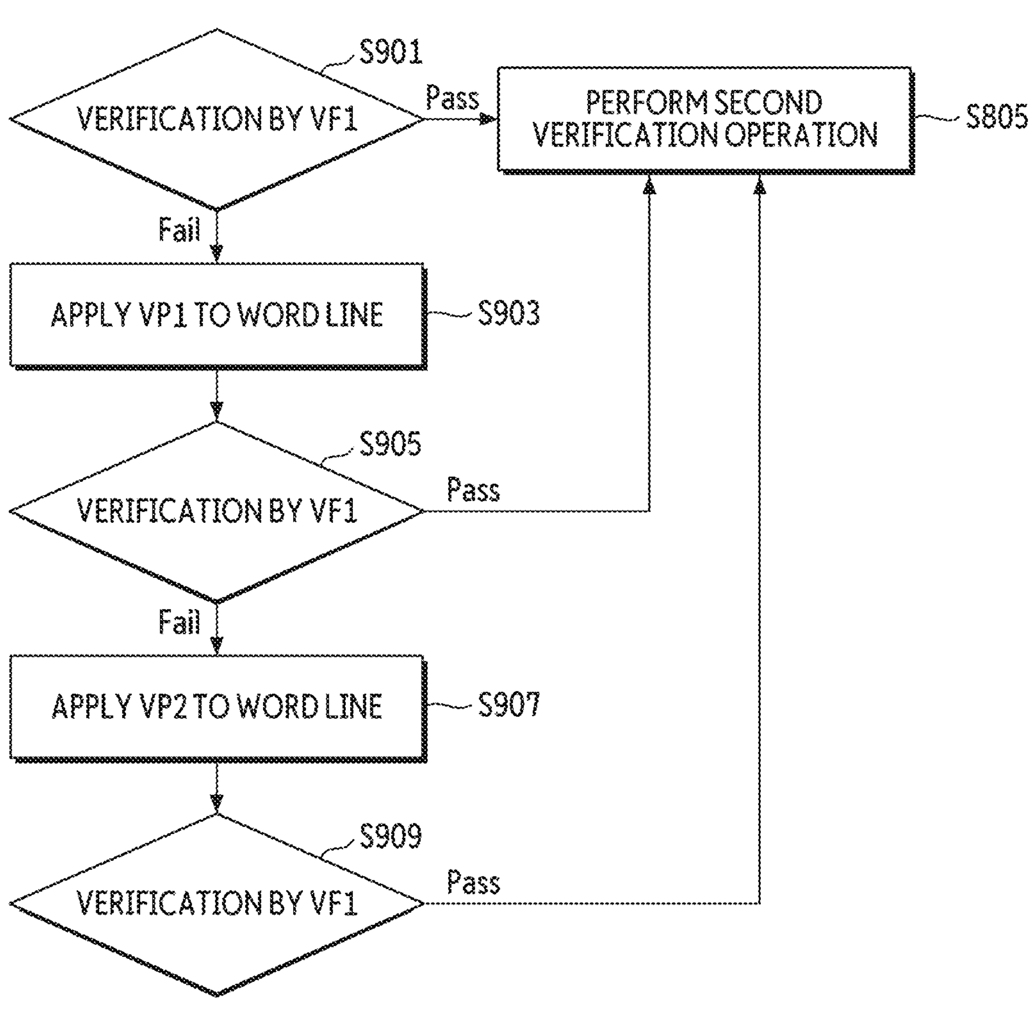
FIGS. 9 and 10 are flowcharts for explaining the program and verification operations of the semiconductor memory device according to some example embodiments.
Figure 10:
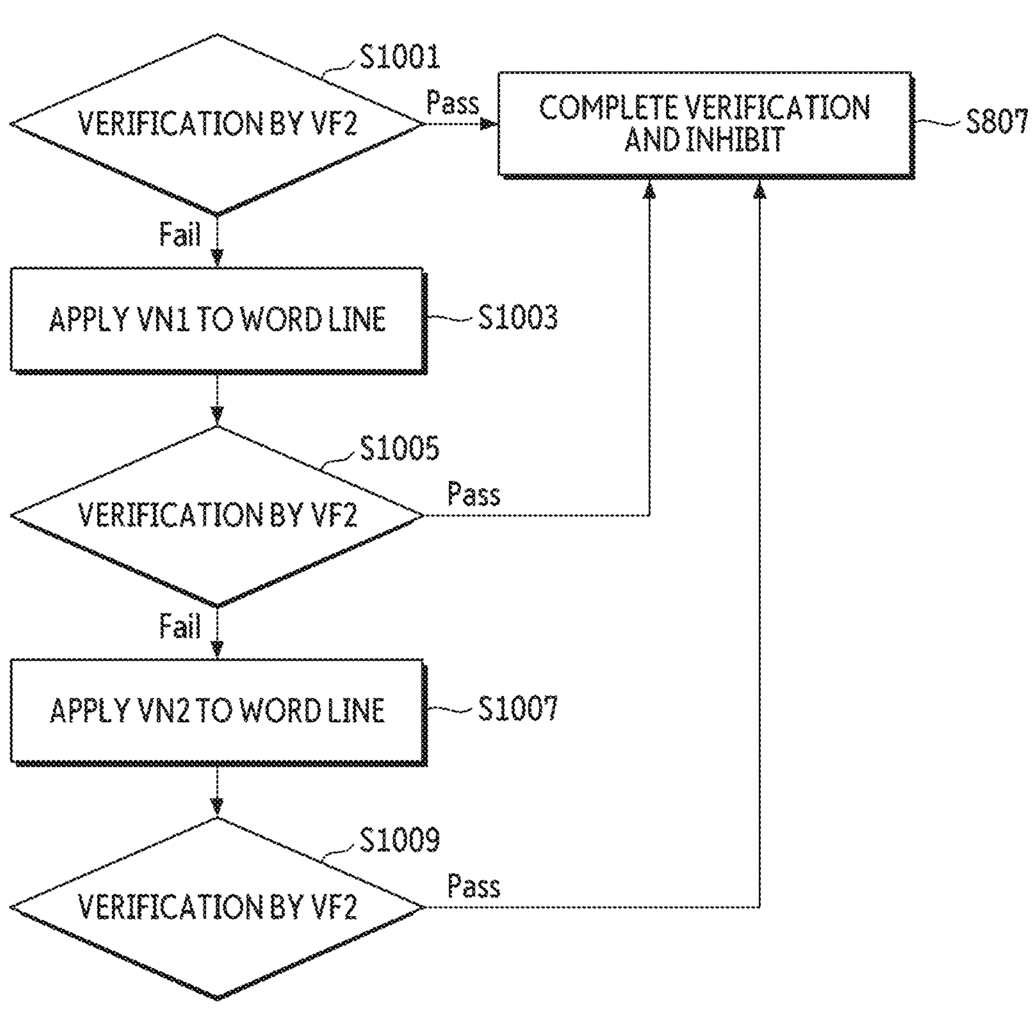
Figure 11:
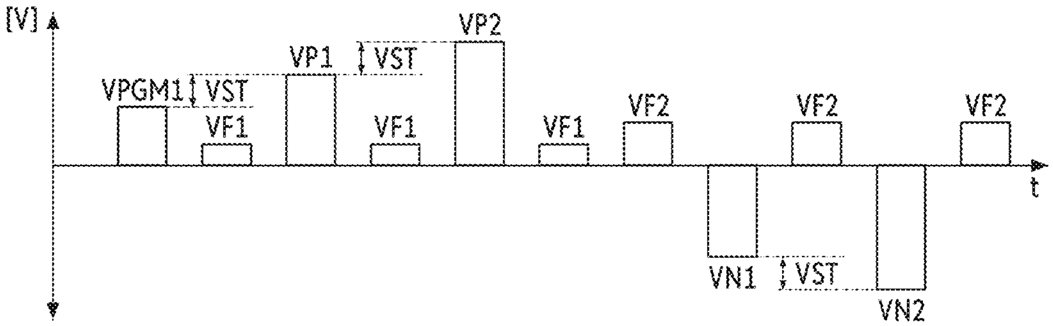
FIG. 11 is a graph for explaining the program and verification operations shown in FIGS. 9 and 10 according to some example embodiments.
Figure 12:
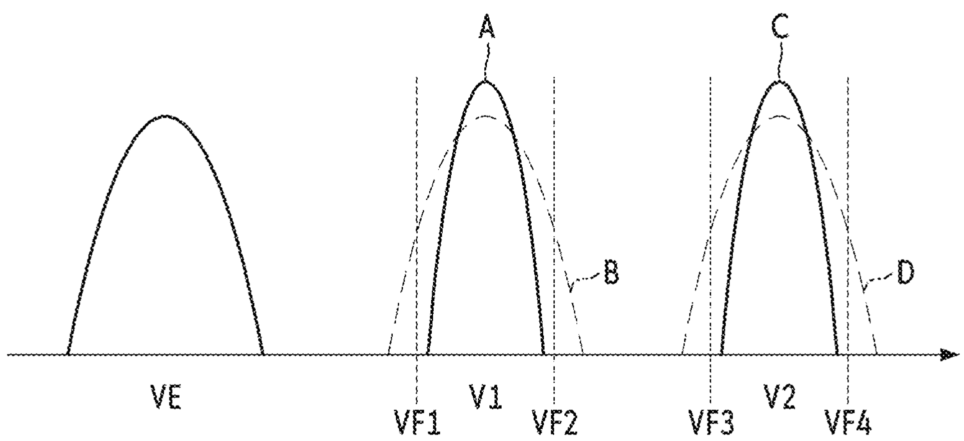
FIG. 12 is a graph for explaining the program and verification operations of the semiconductor memory device according to some example embodiments.

FIGS. 9 and 10 are flowcharts for explaining the program and verification operations of the semiconductor memory device according to some example embodiments. FIG. 11 is a graph for explaining the program and verification operations shown in FIGS. 9 and 10 according to some example embodiments. FIG. 12 is a graph for explaining the program and verification operations of the semiconductor memory device according to some example embodiments. The operations shown in FIGS. 9, 10, and 11 may be performed based on the control logic 37 controlling at least the voltage generator 39. For example, the control logic 37 may be configured to control at least the voltage generator 39 (e.g., based on generating one or more voltage control signals CTRL_vol) to perform (e.g., to cause the semiconductor memory device 10 to perform) any of the operations of the methods shown in FIGS. 9, 10, and/or 11.

Referring to FIGS. 9, 11, and 12, a specific first verification operation is as follows. An x-axis of FIG. 11 represents time, and a y-axis represents the magnitude of the word line voltage at which the program and verification operations are performed.

In some example embodiments, the memory cells of the erased state having an erase threshold voltage VE may be brought into one program state having a first threshold voltage V1 or a second threshold voltage V2 by the program operation.

First, a first program voltage VPGM1 may be applied to the first word line connected to the first memory cell group to have the first threshold voltage V1. At this time, since the inhibit voltage is applied to the bit line connected to the second memory cell group different from the first memory cell group, it may not be programmed by the first program voltage VPGM1.

The distribution of the first memory cell group to which the first program voltage VPGM1 is applied may appear as in the pre-verification state B.

Next, the first memory cell group may be verified by the first verification voltage VF1 (S901).

Specifically, the first verification voltage VF1 may be applied to the first word line connected to the first memory cell group to verify whether the threshold voltage of the memory cells included in the first memory cell group is equal to or greater than the first verification voltage VF1. The first verification voltage VF1 may be a voltage lower than the first threshold voltage V1. At S901, a determination may be made whether respective threshold voltages of the plurality of memory cells of the first memory cell group are equal to or greater than the first verification voltage VF1.

If the threshold voltages of all memory cells included in the first memory cell group are equal to or greater than the first verification voltage VF1 (Pass), a second verifying step is performed (S805).

If the threshold voltages (e.g., respective threshold voltages) of some of the memory cells included in the first memory cell group (e.g., one or more first memory cells of the plurality of memory cells of the first memory cell group) are less than (e.g., smaller than) the first verification voltage VF1 (Fail), the first positive correction voltage VP1 (e.g., a first correction voltage that is a positive first correction voltage) is applied to the first word line connected to the memory cells having threshold voltages lower than the first verification voltage VF1 (e.g., the one or more first memory cells having respective threshold voltages that are each smaller than the first verification voltage VF1) (S903).

The first positive correction voltage VP1 may be a voltage that is greater than the first program voltage VPGM1 by a step voltage VST. For example, the step voltage VST may be 0.2V to 0.3V.

After applying the first positive correction voltage, the first verification voltage VF1 may be applied to the first word line connected to the first memory cell group to verify whether the threshold voltage of the memory cells included in the first memory cell group (e.g., the respective threshold voltages of the memory cells of the first memory cell group) is equal to or greater than the first verification voltage VF1 again (S905).

If the threshold voltages of all memory cells included in the first memory cell group are equal to or greater than the first verification voltage VF1 (Pass), a second verifying step is performed (S805).

If the threshold voltages (e.g., respective threshold voltages) of some of the memory cells included in the first memory cell group (e.g., one or more third memory cells of the plurality of memory cells of the first memory cell group, which may include at least one memory cell of the one or more first memory cells) are less than (e.g., smaller than) the first verification voltage VF1 (Fail), a second positive correction voltage VP2 is applied to the first word line connected to the memory cells having threshold voltages less than the first verification voltage VF1 (e.g., the one or more third memory cells having respective threshold voltages that are each smaller than the first verification voltage VF1) (S907).

The second positive correction voltage VP2 may be referred to herein as a third correction voltage that is a positive correction voltage. The second positive correction voltage VP2 may be a voltage that is greater than the first positive correction voltage VP1 by the step voltage VST. For example, the step voltage VST may be 0.2V to 0.3V.

After applying the second positive correction voltage, the first verification voltage VF1 may be applied to the first word line connected to the first memory cell group to verify whether the threshold voltage of the memory cells included in the first memory cell group is equal to or greater than the first verification voltage VF1 (S909).

If the threshold voltages of all memory cells included in the first memory cell group are equal to or greater than the first verification voltage VF1 (Pass), the second verifying step is performed (S805).

If the threshold voltages of some of the memory cells included in the first memory cell group are still less than the first verification voltage (VF1), a positive correction voltage that increases sequentially like the step voltage may, of course, be applied to the first word line.

Referring to FIGS. 10, 11, and 12, the specific second verification operation is as follows. An x-axis of FIG. 11 represents time, and a y-axis represents the magnitude of the word line voltage at which the program and verification operations are performed.

In some example embodiments, a second verification may be performed on the first memory cell group at which the first verification has been completed.

First, the first memory cell group may be verified by the second verification voltage VF2 (S1001).

Specifically, the second verification voltage VF2 may be applied to the first word line connected to the first memory cell group to verify whether the threshold voltage of the memory cells included in the first memory cell group is equal to or less than the second verification voltage VF2. The second verification voltage VF2 may be a voltage that is greater than the first threshold voltage V1. At S1001, a determination may be made whether respective threshold voltages of the plurality of memory cells of the first memory cell group are equal to or smaller than the second verification voltage VF2.

If the threshold voltages of all memory cells included in the first memory cell group are equal to or less than the second verification voltage VF2 (Pass), all verifications for the first memory cell group are completed and the inhibit voltage may be applied to the bit line connected to the first memory cell group (S807).

If the threshold voltages (e.g., respective threshold voltages) of some of the memory cells included in the first memory cell group (e.g., one or more second memory cells of the plurality of memory cells of the first memory cell group) exceeds (e.g., is greater than) the second verification voltage VF2 (Fail), the first negative correction voltage VN1 is applied to the word line connected to the memory cells having a threshold voltage that exceeds the second verification voltage VF2 (e.g., the one or more second memory cells having respective threshold voltages that are each greater than the second verification voltage VF2) (S1003).

An absolute value (e.g., absolute magnitude) of the first negative correction voltage VN1 (e.g., second correction voltage) may be smaller than or equal to an absolute value of the first positive correction voltage VP1 (e.g., first correction voltage). An absolute value of the first negative correction voltage VN1 may be smaller than an absolute value of the erase voltage.

After applying the first negative correction voltage, the second verification voltage VF2 may be applied to the first word line connected to the first memory cell group to verify whether the threshold voltage of the memory cells included in the first memory cell group (e.g., the respective threshold voltages of the memory cells of the first memory cell group) is equal to or less than the second verification voltage VF2 again (S1005).

If the threshold voltages of all memory cells included in the first memory cell group are equal to or less than the second verification voltage VF2 (Pass), all verifications for the first memory cell group are completed, and the inhibit voltage may be applied to the bit line connected to the first memory cell group (S807).

If the threshold voltages (e.g., respective threshold voltages) of some of the memory cells included in the first memory cell group (e.g., one or more fourth memory cells of the plurality of memory cells of the first memory cell group, which may include at least one memory cell of the one or more second memory cells) exceed the second verification voltage VF2 (Fail), the second negative correction voltage is applied to the first word line connected to the memory cells having a threshold voltage that exceeds the second verification voltage VF2 (e.g., the one or more fourth memory cells having respective threshold voltages that are each greater than the second verification voltage VF2) (S1007).

The second negative correction voltage VN2 may be referred to herein as a fourth correction voltage that is a negative correction voltage. The second negative correction voltage VN2 may be a voltage that is smaller than the first negative correction voltage VN1 by the step voltage VST. For example, the step voltage VST may be 0.2V to 0.3V.

After applying the second negative correction voltage, the second verification voltage VF2 may be applied to the first word line connected to the first memory cell group to verify whether the threshold voltage of the memory cells included in the first memory cell group is equal to or less than the second verification voltage VF2 again (S1009).

If the threshold voltages of all memory cells included in the first memory cell group are equal to or less than the second verification voltage VF2 (Pass), all verifications for the first memory cell group are completed, and the inhibit voltage may be applied to the bit line connected to the first memory cell group (S807).

If the threshold voltages of some of the memory cells included in the first memory cell group still exceed the second verification voltage VF2, it is a matter of course that a negative correction voltage that sequentially decreases like the step voltage may be additionally applied to the first word line.

Referring to FIG. 12, the distribution of the first memory cell group after the first verification and the second verification may appear as in the post-verification state A.

The program and verification operations may then be performed on the second memory cell group. Because the program and verification operations for the second memory cell group may be performed in the manner similar to the program and verification operations for the first memory cell group, repeated parts of contents explained through FIGS. 8 to 11 will be briefly explained or omitted.

First, the second program voltage may be applied to the word line connected to the second memory cell group to have a second threshold voltage V2. The second threshold voltage V2 may be a voltage that is greater than the first threshold voltage V1.

The distribution of the second memory cell group after the program operation may appear as in a pre-verification state D.

Next, a third verification by the third verification voltage VF3 and a fourth verification by the fourth verification voltage VF4 may be performed on the second memory cell group. The third verification voltage VF3 may be a voltage that is smaller than the second threshold voltage V2. The fourth verification voltage VF4 may be a voltage that is greater than the second threshold voltage V2.

The distribution of the first memory cell group after the third verification and the fourth verification may appear as in a post-verification state C.

In this way, by performing a bidirectional verification by the verification voltage that is greater and smaller than the threshold voltage, it is possible to form the narrow distribution width of the plurality of memory cells having each threshold voltage. Accordingly, each program state may be clearly distinguished, and a semiconductor memory device 10 having improved reliability may be provided.

Figure 13:
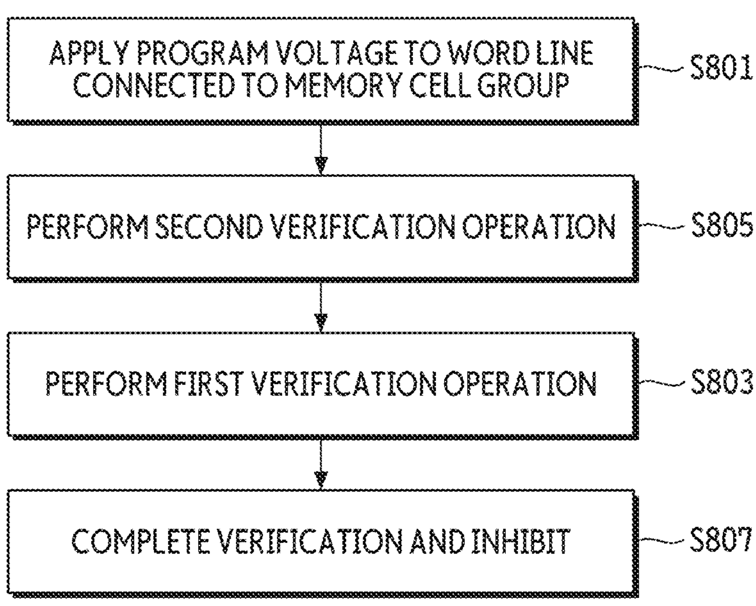
FIG. 13 is a flowchart for explaining program and verification operations of the semiconductor memory device according to some example embodiments.
Figure 14:
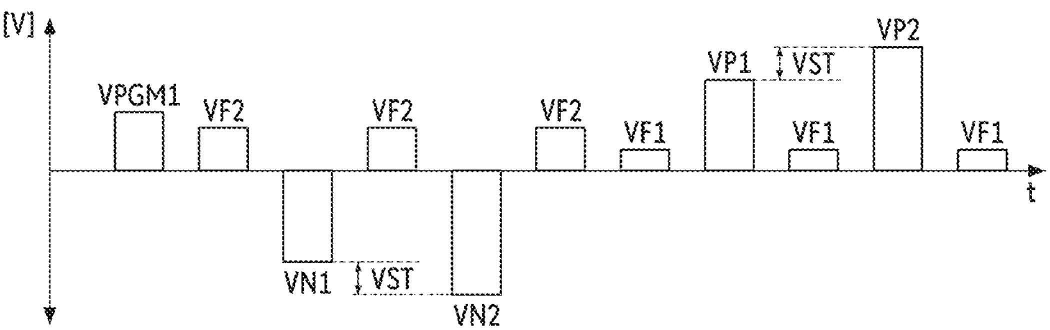
FIG. 14 is a graph for explaining the program and verification operations of the semiconductor memory device according to some example embodiments.

FIG. 13 is a flowchart for explaining program and verification operations of the semiconductor memory device according to some example embodiments. FIG. 14 is a graph for explaining the program and verification operations of the semiconductor memory device according to some example embodiments. The operations shown in FIGS. 13 and 14 may be performed based on the control logic 37 controlling the voltage generator 39. For example, the control logic 37 may be configured to control at least the voltage generator 39 (e.g., based on generating one or more voltage control signals CTRL_vol) to perform (e.g., to cause the semiconductor memory device 10 to perform) any of the operations of the methods shown in FIGS. 13 and/or 14.

Referring to FIGS. 12 to 14, the memory cells of the erased state having an erase threshold voltage VE may be brought into one program state having a first threshold voltage V1 or a second threshold voltage V2 by the program operation (S801).

For example, the program operation may be performed which applies the first program voltage VPGM1 to the word line connected to the first memory cell group, among the memory cells of the erased state having the erase threshold voltage VE, so that the first memory cell group has the first threshold voltage V1 (S801).

After the program operation is performed, the distribution of threshold voltages of the memory cells included in the first memory cell group may appear as in a pre-verification state B indicated by a dotted line.

Thereafter, a second verification operation performed by the second verification voltage VF2 greater than the first threshold voltage V1 may be performed on the first memory cell group of the pre-verification state A before the first verification operation (S805). Because a specific explanation about the second verification operation corresponds to that explained through FIGS. 10 and 11, the explanation will not be provided.

Next, a first verification operation performed by the first verification voltage VF1 smaller than the first threshold voltage V1 may be performed on the first memory cell group (S803). Because the specific explanation about the first verification operation corresponds to that explained through FIGS. 9 and 11, the explanation will not be provided.

The inhibit voltage may be applied to the first memory cell group at which the first verification and second verification operations have been completed (S807).

After the first verification and second verification operations are performed, the distribution of the threshold voltages of the memory cells included in the first memory cell group appears as in the post-verification state A shown by a solid line.

The program and verification operations may then be performed on the second memory cell group. Because the program and verification operations for the second memory cell group may be performed in the manner similar to the program and verification operations for the first memory cell group, repeated parts of contents explained through FIGS. 8 to 11 will be briefly explained or omitted.

First, the second program voltage may be applied to the word line connected to the second memory cell group to have the second threshold voltage V2. The second threshold voltage V2 may be a voltage that is greater than the first threshold voltage V1.

The distribution of the second memory cell group after the program operation may appear as in the pre-verification state D.

Next, a third verification by the third verification voltage VF3 and a fourth verification by the fourth verification voltage VF4 may be performed on the second memory cell group. The third verification voltage VF3 may be a voltage that is smaller than the second threshold voltage V2. The fourth verification voltage VF4 may be a voltage that is greater than the second threshold voltage V2.

The distribution of the second memory cell group after the third verification and the fourth verification may appear as the post-verification state C.

In this way, by performing a bidirectional verification by the verification voltage that is greater and smaller than the threshold voltage, it is possible to form the narrow distribution width of the plurality of memory cells having each threshold voltage. Accordingly, each program state may be clearly distinguished, and a semiconductor memory device 10 having improved reliability may be provided.

Figure 15:
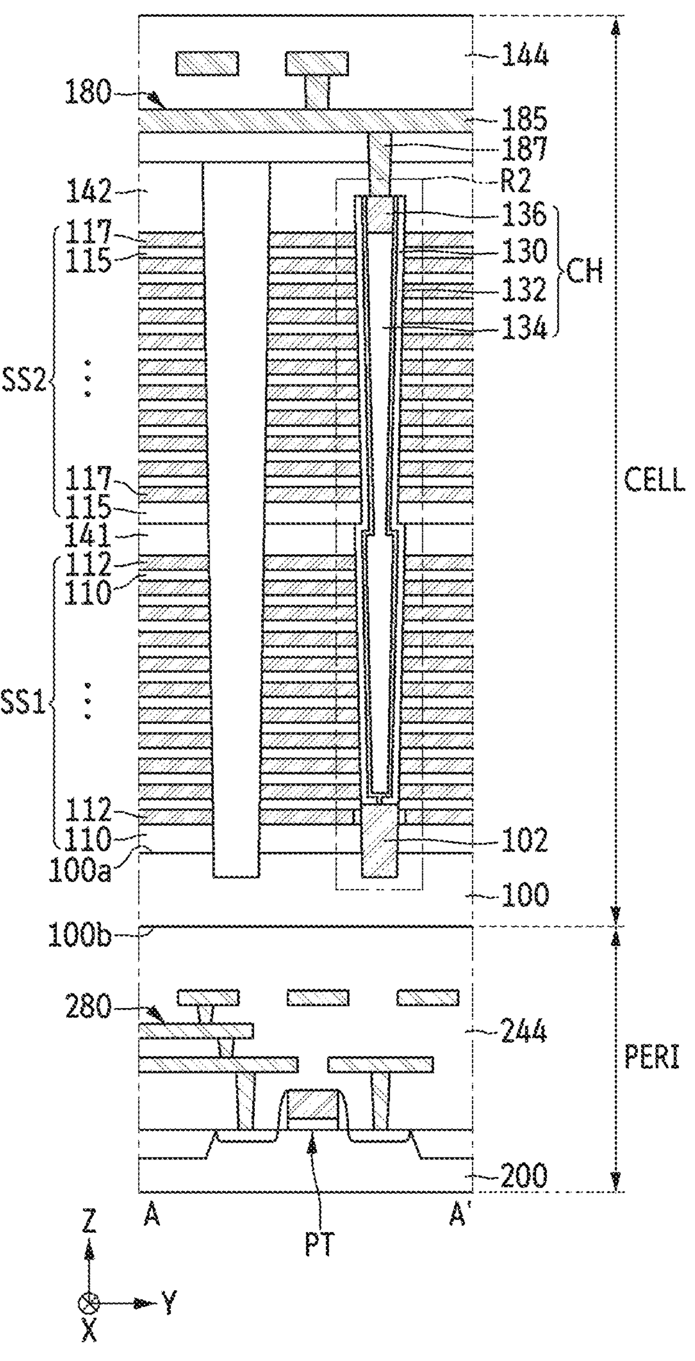
FIG. 15 is a schematic cross-sectional view for explaining a semiconductor memory device according to some example embodiments.
Figure 16:
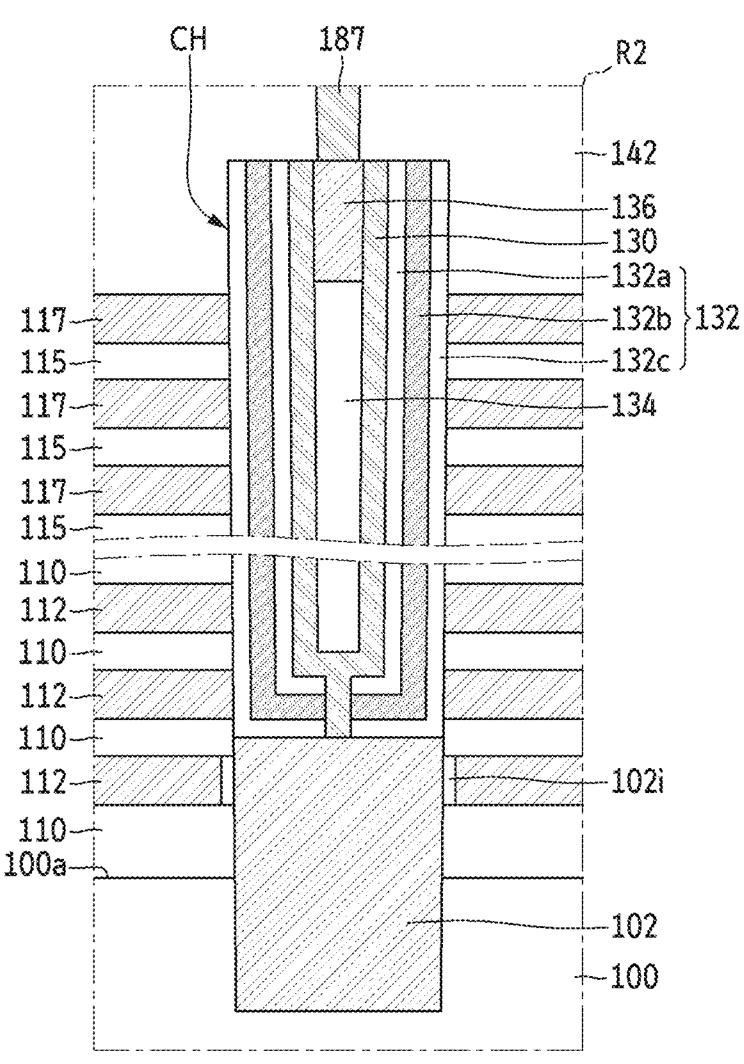
FIG. 16 is an enlarged view for explaining a region R2 of FIG. 13 according to some example embodiments.

FIG. 15 is a schematic cross-sectional view for explaining a semiconductor memory device according to some example embodiments. FIG. 16 is an enlarged view for explaining a region R2 of FIG. 13 according to some example embodiments. For convenience of explanation, repeated parts of contents explained using FIGS. 1 to 14 will be briefly explained or omitted.

Referring to FIGS. 15 and 16, the semiconductor memory device according to some example embodiments include a source pattern 102.

The source pattern 102 may be formed on the first substrate 100. The source pattern 102 may be interposed between the first substrate 100 and the channel pattern 130, and between the first substrate 100 and the data storage pattern 132. The source pattern 102 may be electrically connected to the channel pattern 130. For example, one end (e.g., a lower end) of the channel pattern 130 may penetrate the bottom of the data storage pattern 132 and may be in contact with the upper face of the source pattern 102.

The source pattern 102 may include a conductive material, for example, but not limited to, impurity-doped polysilicon or metal. As an example, the source pattern 102 may include a polysilicon film doped with an N-type impurity (e.g., phosphorus (P) or arsenic (As)). In some example embodiments, the source pattern 102 may be formed from the first substrate 100 by a selective epitaxial growth process. The first substrate 100 and the source pattern 102 may be provided as a common source line (e.g., CSL of FIG. 2) of the semiconductor device according to some example embodiments.

In some example embodiments, the source pattern 102 may be formed to be higher than the upper face of the lowermost gate electrode disposed at the lowermost part among the first gate electrodes 112. The source pattern 102 may be spaced apart from the lowermost gate electrode by a side insulating film 102*i*.

Figure 17:
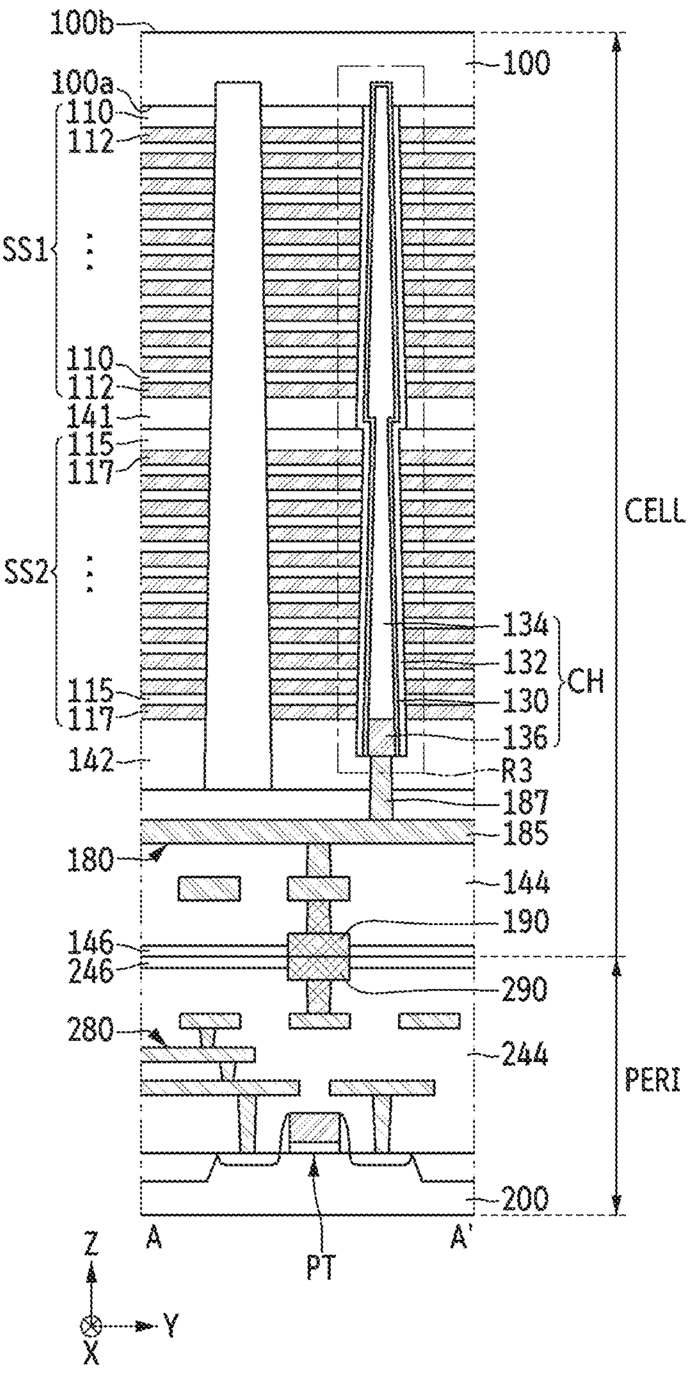
FIG. 17 is a schematic cross-sectional view for explaining a semiconductor memory device according to some example embodiments.
Figure 18:
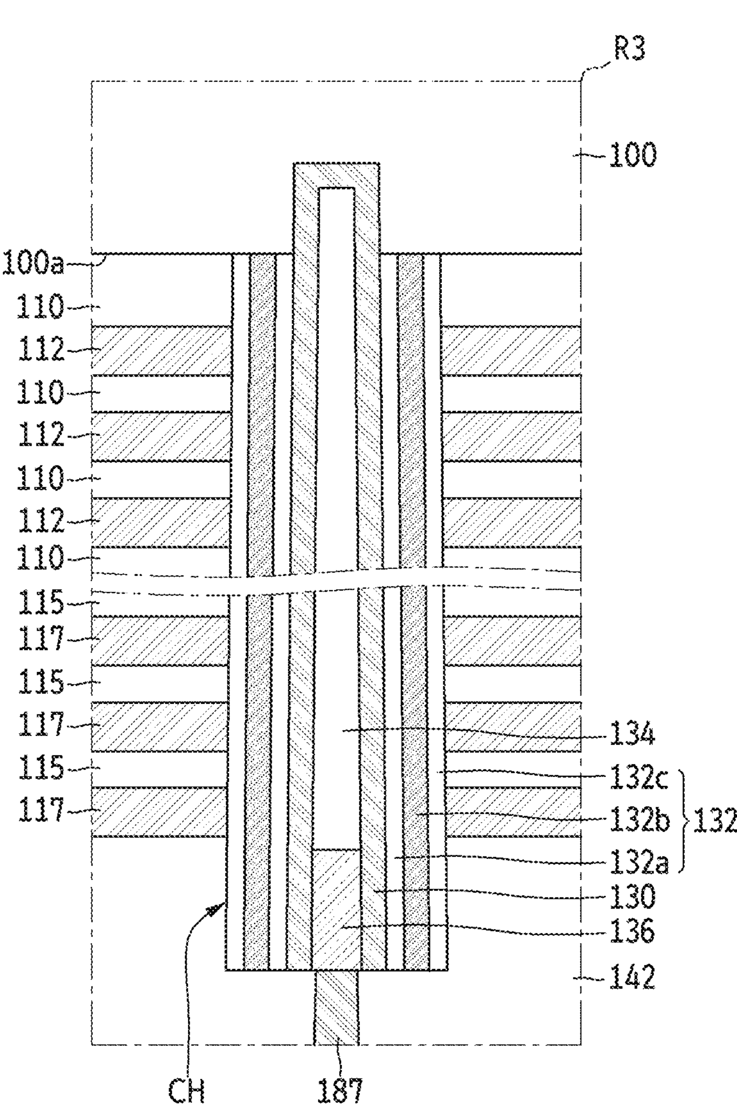
FIG. 18 is an enlarged view for explaining a region R3 of FIG. 17 according to some example embodiments.

FIG. 17 is a schematic cross-sectional view for explaining a semiconductor memory device according to some example embodiments. FIG. 18 is an enlarged view for explaining a region R3 of FIG. 17 according to some example embodiments. For convenience of explanation, repeated parts of those explained above using FIGS. 1 to 14 will be briefly explained or omitted.

Referring to FIGS. 17 and 18, in the semiconductor memory device according to some example embodiments, the first side 100*a* of the first substrate 100 is opposite to the peripheral circuit structure PERI.

For example, the semiconductor device according to some example embodiments may be a C2C (chip-to-chip) structure. The C2C structure may mean a structure in which an upper chip including a memory cell structure CELL is manufactured on a first wafer, a lower chip including a peripheral circuit structure PERI is manufactured on a second wafer different from the first wafer, and then, the upper chip and the lower chip are connected to each other by a bonding type.

As an example, the bonding type may mean a type that electrically connects a first bonding metal 190 (and/or a first bonding insulating film 146) formed on the uppermost metal layer of the upper chip and a second bonding metal 290 (and/or a second bonding insulating film 246) formed on the uppermost metal layer of the lower chip to each other. For example, when the first bonding metal 190 and the second bonding metal 290 are formed of copper (Cu), the bonding type may be a Cu—Cu bonding type. However, this is merely an example, and the first bonding metal 190 and the second bonding metal 290 may, of course, be formed of various other metals such as aluminum (Al) or tungsten (W).

As the first bonding metal 190 and the second bonding metal 290 are bonded, the first wiring structure 180 may be electrically connected to the second wiring structure 280. Accordingly, a plurality of memory cells formed in the cell array region CA may be electrically connected to the peripheral circuit element PT.

Figure 19:
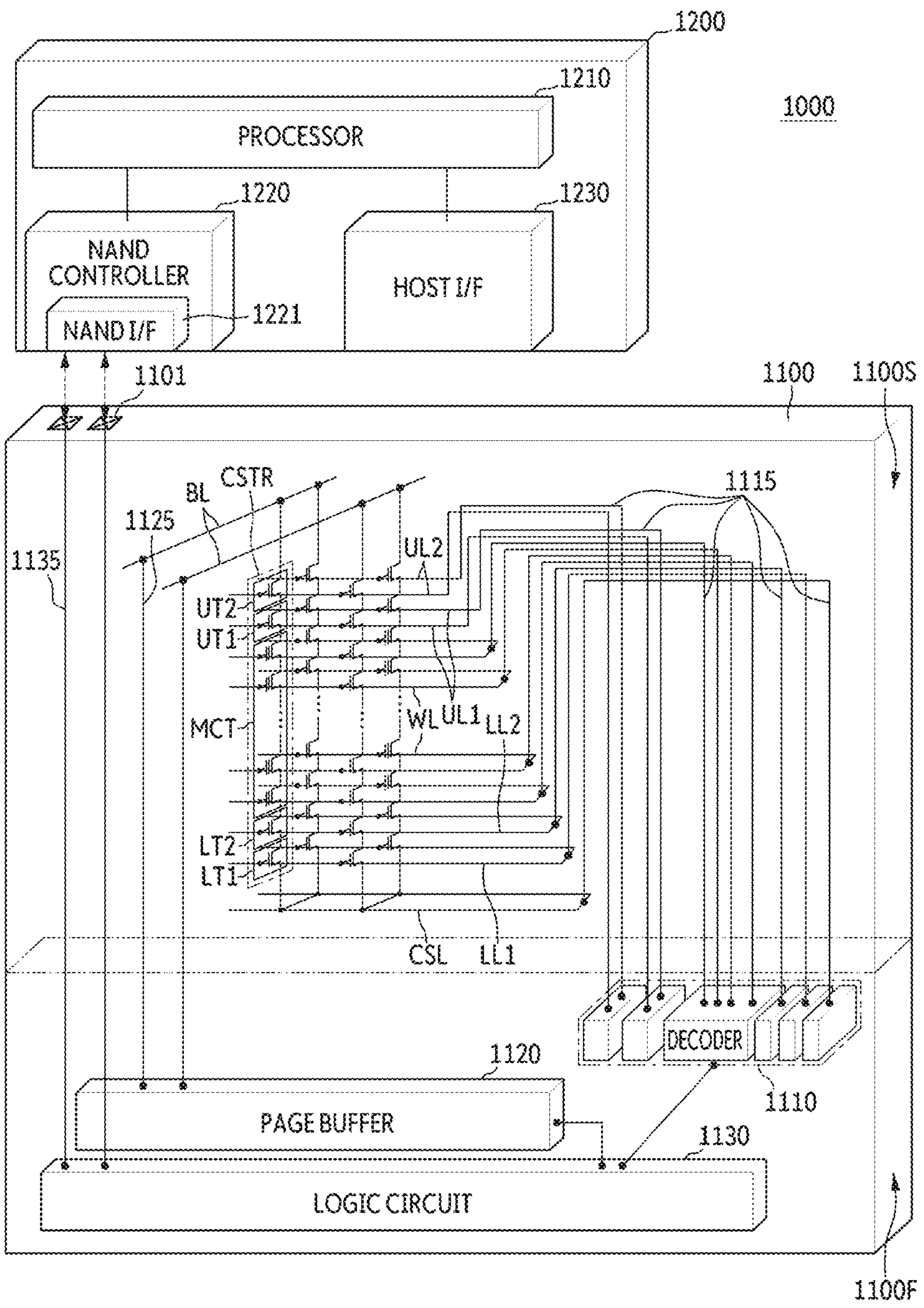
FIG. 19 is an example block diagram for explaining an electronic system according to some example embodiments.
Figure 20:
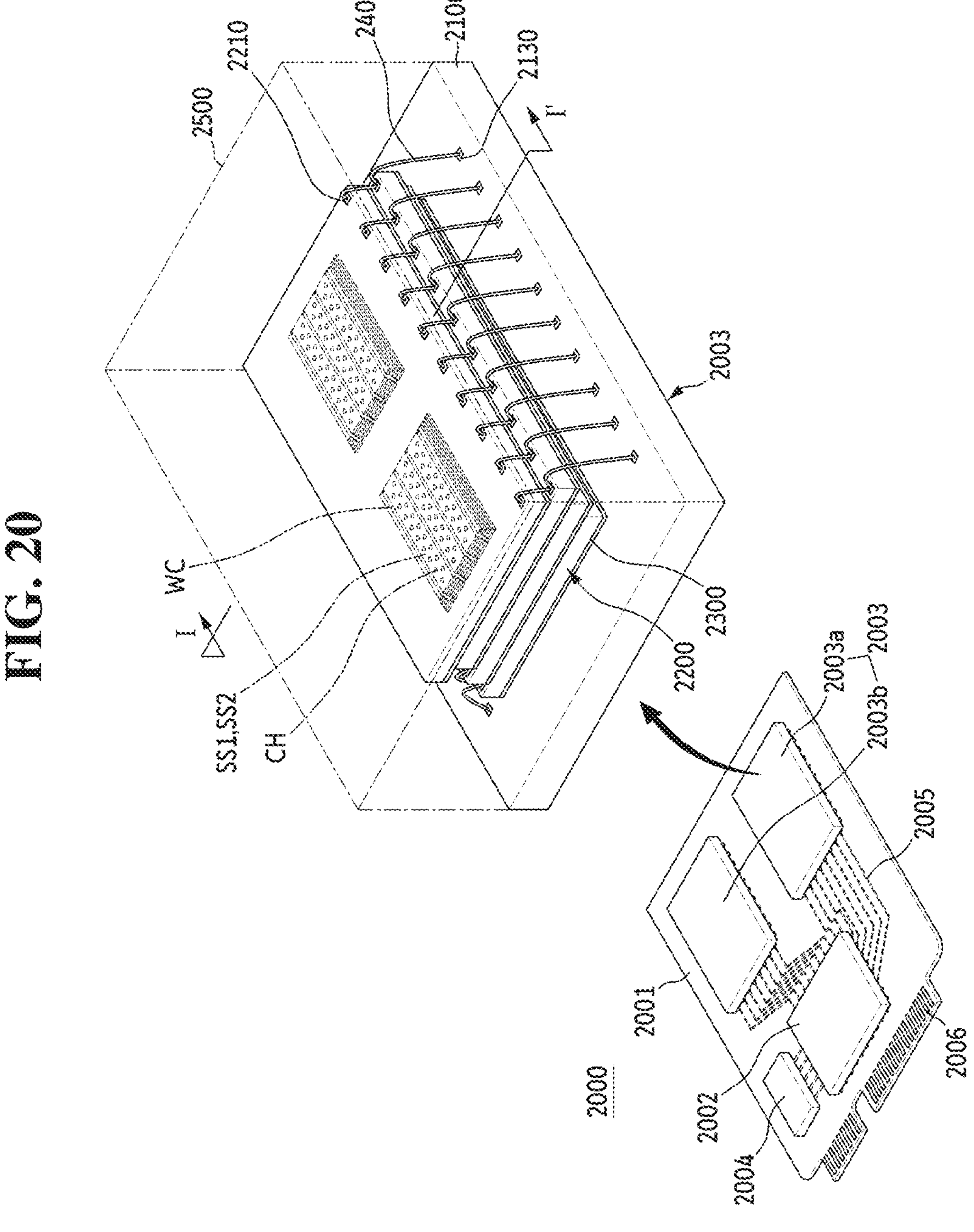
FIG. 20 is an example perspective view for explaining the electronic system according to some example embodiments.
Figure 21:
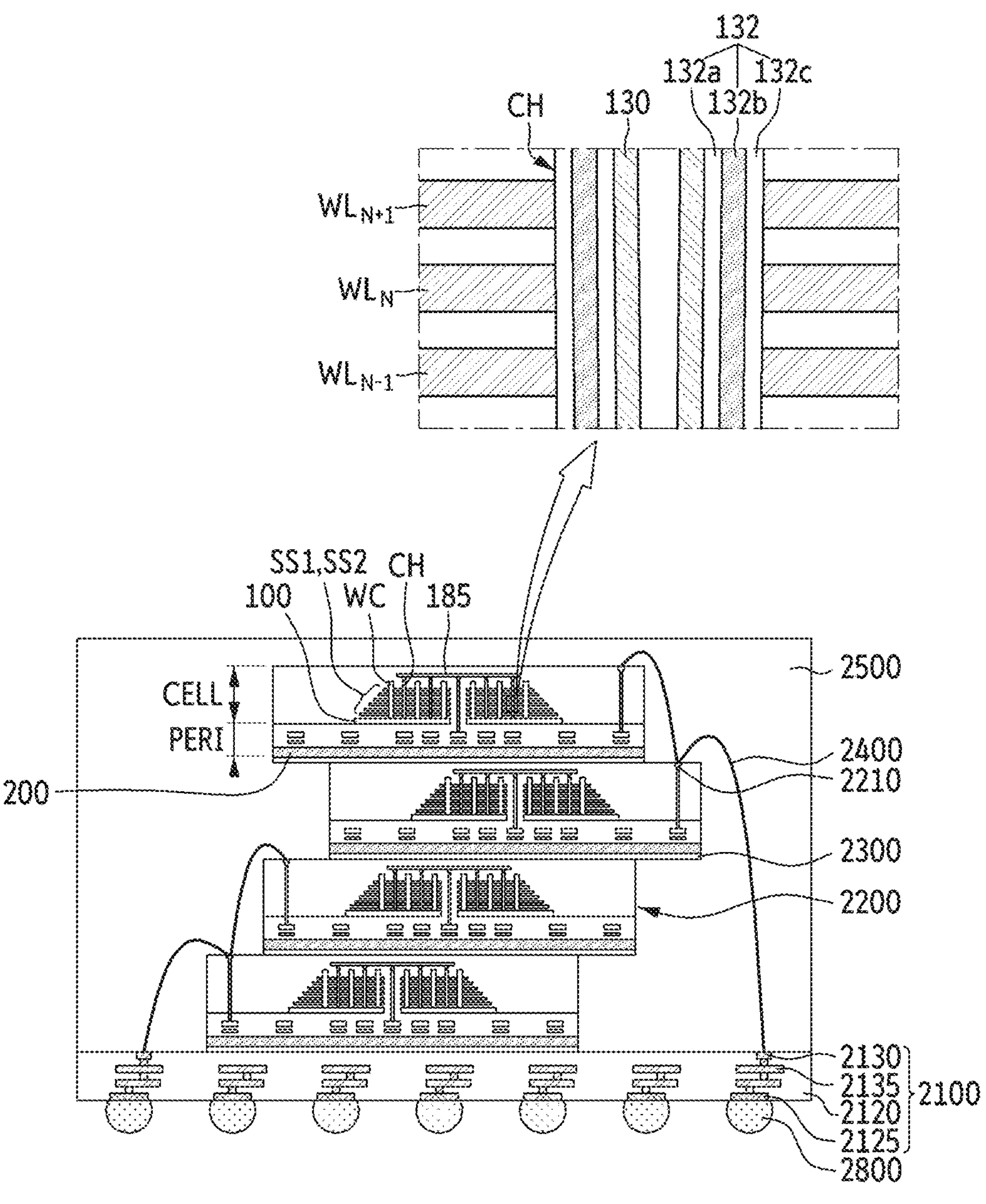
FIG. 21 is a schematic cross-sectional view taken along I-I' of FIG. 20 according to some example embodiments.

FIG. 19 is an example block diagram for explaining an electronic system according to some example embodiments. FIG. 20 is an example perspective view for explaining the electronic system according to some example embodiments. FIG. 21 is a schematic cross-sectional view taken along I-I' of FIG. 20 according to some example embodiments. For convenience of explanation, repeated parts of those explained above using FIGS. 1 to 18 will be briefly explained or omitted.

Referring to FIG. 19, an electronic system 1000 according to some example embodiments may include a semiconductor memory device 1100, and a controller 1200 that is electrically connected to the semiconductor memory device 1100. The electronic system 1000 may be a storage device that includes one or multiple semiconductor memory devices 1100, or an electronic device that includes the storage device. For example, the electronic system 1000 may be an SSD device (solid state drive device), a USB (Universal Serial Bus), a computing system, a medical device or a communication device that includes one or multiple semiconductor memory devices 1100.

The semiconductor memory device 1100 may be a non-volatile memory device (e.g., a NAND flash memory device), and may include, for example, at least one of the semiconductor memory devices explained above using FIGS. 1 to 18. The semiconductor memory device 1100 may include a first structure 1100F, and a second structure 1100S on the first structure 1100F.

The first structure 1100F may be a peripheral circuit structure that includes a decoder circuit 1110 (e.g., the row decoder 33 of FIG. 1), a page buffer 1120 (e.g., the page buffer 35 of FIG. 1), and a logic circuit 1130 (e.g., the control logic 37 of FIG. 1). The first structure 1100F may correspond to, for example, the peripheral circuit structure PERI explained above using FIGS. 1 to 18.

The second structure 1100S may be a memory cell structure that includes bit lines BL, a common source line CSL, word lines WL, first and second gate upper lines UL1 and UL2, first and second gate lower lines LL1 and LL2, and memory cell strings CSTR between the bit lines BL and the common source line CSL. The second structure 1100S may correspond to, for example, the memory cell structure CELL explained above using FIGS. 1 to 18.

In the second structure 1100S, each memory cell string CSTR may include lower transistors LT1 and LT2 adjacent to the common source line CSL, upper transistors UT1 and UT2 adjacent to the bit lines BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be modified variously depending on the embodiments.

In some example embodiments, the upper transistors UT1 and UT2 may include string selection transistors, and the lower transistors LT1 and LT2 may include ground selection transistors. Each of the gate lower lines LL1 and LL2 may be gate electrodes of the lower transistors LT1 and LT2. The word lines WL may be the gate electrodes of the memory cell transistors MCT, and the gate upper lines UL1 and UL2 may be the gate electrodes of the upper transistors UT1 and UT2, respectively.

In some example embodiments, the lower transistors LT1 and LT2 may include a lower erase control transistor LT1 and a ground selection transistor LT2 that are connected in series. In some example embodiments, the upper transistors UT1 and UT2 may include a string selection transistor UT1 and an upper erase control transistor UT2 that are connected in series. At least one of the lower erase control transistor LT1 and the upper erase control transistor UT1 may be used for an erasing operation that erases data stored in the memory cell transistor MCT, by using a gate induce drain leakage (GADL) phenomenon.

The common source line CSL, the first and second gate lower lines LL1 and LL2, the word lines WL, and the first and second gate upper lines UL1 and UL2 may be electrically connected to the decoder circuit 1110 through the first connection wirings 1115 extending from the inside of the first structure 1100F to the second structure 1100S. The bit lines BL may be electrically connected to the page buffer 1120 through second connection wirings 1125 extending from the inside of the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor memory device 1100 may communicate with the controller 1200 through an I/O pad 1101 electrically connected to the logic circuit 1130. The I/O pad 1101 may be electrically connected to the logic circuit 1130 through an I/O connection wiring 1135 extending from the inside of the first structure 1100F to the second structure 1100S.

The controller 1200 may include a processor 1210, a NAND controller 1220, and a host interface 1230. In some example embodiments, the electronic system 1000 may include a plurality of semiconductor memory devices 1100, and in this case, the controller 1200 may control the plurality of semiconductor memory devices 1100.

The processor 1210 may control the operation of the overall electronic system 1000 including the controller 1200. The processor 1210 may operate according to a predetermined firmware, and may control the NAND controller 1220 to access the semiconductor memory device 1100. The NAND controller 1220 may include a NAND interface 1221 that processes communication with the semiconductor memory device 1100. Control command for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When the control command is received from the external host through the host interface 1230, the processor 1210 may control the semiconductor memory device 1100 in response to the control command.

Referring to FIGS. 20 and 21, the electronic system 2000 according to some example embodiments may include a main board 2001, a main controller 2002 mounted on the main board 2001, one or more semiconductor packages 2003, and a DRAM 2004. The semiconductor package 2003 and the DRAM 2004 may be connected to the main controller 2002 by wiring patterns 2005 formed on the main board 2001.

The main board 2001 may include a connector 2006 including a plurality of fins coupled to an external host. The number and placement of the plurality of fins in the connector 2006 may vary depending on the communication interface between the electronic system 2000 and the external host. In some example embodiments, the electronic system 2000 may communicate with the external host in accordance with any one of interfaces such as M-Phy for USB (Universal Serial Bus), PCI-Express (Peripheral Component Interconnect Express), SATA (Serial Advanced Technology Attachment), and UFS (Universal Flash Storage). In some example embodiments, the electronic system 2000 may operate by power supplied from the external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for relieving a speed difference between the semiconductor package 2003, which is a data storage space, and the external host. The DRAM 2004 included in the electronic system 2000 may also operate as a kind of cache memory, and may also provide a space for temporarily storing data in the control operation on the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include a first semiconductor package 2003*a* and a second semiconductor package 2003*b* that are spaced apart from each other. Each of the first semiconductor package 2003*a* and the second semiconductor package 2003*b* may be a semiconductor package that includes a plurality of semiconductor chips 2200. Each of the first semiconductor package 2003*a* and the second semiconductor package 2003*b* may include a package substrate 2100, semiconductor chips 2200 on the package substrate 2100, adhesive layers 2300 disposed on the lower faces of each of the semiconductor chips 2200, a connecting structure 2400 for electrically connecting the semiconductor chips 2200 and the package substrate 2100, and a molding layer 2500 that covers the semiconductor chips 2200 and the connecting structure 2400 on the package substrate 2100.

The package substrate 2100 may be a printed circuit board that includes package upper pads 2130. Each semiconductor chip 2200 may include an I/O pad 2210. The I/O pad 2210 may correspond to the I/O pad 1101 of FIG. 19.

In some example embodiments, the connecting structure 2400 may be a bonding wire that electrically connects the I/O pad 2210 and the package upper pads 2130. Therefore, in each of the first semiconductor package 2003*a* and the second semiconductor package 2003*b*, the semiconductor chips 2200 may be electrically connected to each other by a bonding wire type, and may be electrically connected to the package upper pads 2130 of the package substrate 2100. In some example embodiments, in each of the first semiconductor package 2003*a* and the second semiconductor package 2003*b*, the semiconductor chips 2200 may be electrically connected to each other by a connecting structure including a through electrode (Through Silicon Via, TSV) instead of the connecting structure 2400 of the bonding wire type.

In some example embodiments, the main controller 2002 and the semiconductor chips 2200 may be included in a single package. In some example embodiments, the main controller 2002 and the semiconductor chips 2200 are mounted on a separate interposer substrate different from the main board 2001, and the main controller 2002 and the semiconductor chips 2200 may be connected to each other by the wiring formed on the interposer substrate.

In some example embodiments, the package substrate 2100 may be a printed circuit board. The package substrate 2100 may include a package substrate body portion 2120, package upper pads 2130 disposed on an upper face of the package substrate body portion 2120, lower pads 2125 disposed on a lower face of the package substrate body portion 2120 or exposed through the lower face, and inner wirings 2135 that electrically connect the package upper pads 2130 and the lower pads 2125 inside the package substrate body portion 2120. The package upper pads 2130 may be electrically connected to the connecting structures 2400. The lower pads 2125 may be connected to the wiring patterns 2005 of the main board 2001 of the electronic system 2000 through conductive connections 2800, as in FIG. 20.

In the electronic system according to some example embodiments, each of the semiconductor chips 2200 may include the semiconductor memory device described above using FIGS. 1 to 15. For example, each of the semiconductor chips 2200 may include a peripheral circuit structure PERI, and a memory cell structure CELL stacked on the peripheral circuit structure PERI. As an example, the memory cell structure CELL may include the first substrate 100, the stacked structures SS1 and SS2, the channel structure CH, the cutting pattern WC, and the conductive line 185 explained above using FIGS. 1 to 18. Further, as an example, the peripheral circuit structure PERI may include the second substrate 200 and the peripheral circuit element PT explained above using FIGS. 1 to 18.

As described herein, any devices, systems, modules, portions, units, controllers, circuits, and/or portions thereof according to any of the example embodiments, and/or any portions thereof (including, without limitation, the semiconductor memory device 10, the memory cell array 30, the row decoder 33, the page buffer 35, the control logic 37, the voltage generator 39, the electronic system 1000, the semiconductor memory device 1100, the controller 1200, the decoder circuit 1110, the page buffer 1120, the logic circuit 1130, the processor 1210, the NAND controller 1220, the host interface 1230, the electronic system 2000, the main board 2001, the main controller 2002, the one or more semiconductor packages 2003, the DRAM 2004, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, portions, units, controllers, circuits, and/or portions thereof according to any of the example embodiments.

Although the embodiments of the present inventive concepts have been described above with reference to the accompanying drawings, the present inventive concepts are not limited to the above embodiments, and may be fabricated in various different forms. Those skilled in the art will appreciate that the present inventive concepts may be embodied in other specific forms without changing the technical spirit or essential features of the present inventive concepts. Accordingly, the above-described example embodiments should be understood in all respects as illustrative and not restrictive.

What is claimed is:

1. A semiconductor memory device, comprising:

a substrate;

a memory cell array, the memory cell array including a plurality of memory cells, each memory cell configured to store a plurality of bits, a plurality of word lines, the plurality of word lines connected to the plurality of memory cells and extending in a first direction on the substrate, and a plurality of bit lines, the plurality of bit lines connected to the plurality of memory cells and extending in a second direction intersecting the first direction;

a voltage generator, the voltage generator configured to generate a voltage applied to the memory cell array; and a control logic, the control logic configured to control the voltage generator, wherein the plurality of word lines include a first word line, wherein the plurality of memory cells includes a first memory cell group and a second memory cell group, wherein the first word line is connected to both the first memory cell group and the second memory cell group, wherein the control logic is configured to control the voltage generator to cause the semiconductor memory device to apply an erase voltage to the substrate, the erase voltage is a positive (+) erase voltage, apply a first program voltage to the first word line such that the first memory cell group has a first threshold voltage, the first program voltage is a positive (+) first program voltage, determine whether respective threshold voltages of memory cells of the first memory cell group are equal to or greater than a first verification voltage, the first verification voltage smaller than the first threshold voltage, apply a first correction voltage to the first word line connected to one or more first memory cells of the first memory cell group to perform a first verification based on a determination that the one or more first memory cells have respective threshold voltages smaller than the first verification voltage, the first correction voltage is a positive (+) first correction voltage, determine whether respective threshold voltages of the memory cells of the first memory cell group are equal to or smaller than a second verification voltage, the second verification voltage greater than the first threshold voltage, and apply a second correction voltage to the first word line connected to one or more second memory cells of the first memory cell group to perform a second verification based on a determination that the one or more second memory cells have respective threshold voltages greater than the second verification voltage, the second correction voltage is a negative (−) second correction voltage.

2. The semiconductor memory device of claim 1, wherein the control logic is configured to control the voltage generator to cause the semiconductor memory device to apply an inhibit voltage to a bit line connected to the second memory cell group such that the second memory cell group is not programmed in response to the first program voltage being applied to the first word line such that the first memory cell group has the first threshold voltage.

3. The semiconductor memory device of claim 2, wherein the first verification is performed prior to performing the second verification, and the control logic is configured to control the voltage generator to cause the semiconductor memory device to determine, in response to applying the first correction voltage, whether respective threshold voltages of the memory cells of the first memory cell group are equal to or greater than the first verification voltage, apply a third correction voltage to the first word line connected to one or more third memory cells of the first memory cell group based on a determination that the one or more third memory cells have respective threshold voltages smaller than the first verification voltage, the third correction voltage greater than the first correction voltage, determine, in response to applying the second correction voltage, whether respective threshold voltages of the memory cells of the first memory cell group are equal to or smaller than the second verification voltage, and apply a fourth correction voltage to the first word line connected to one or more fourth memory cells of the first memory cell group based on a determination that the one or more fourth memory cells have respective threshold voltages greater than the second verification voltage, the fourth correction voltage smaller than the second correction voltage.

4. The semiconductor memory device of claim 3, wherein the third correction voltage is greater than the first correction voltage by 0.2V to 0.3V, and the second correction voltage is greater than the fourth correction voltage by 0.2V to 0.3V.

5. The semiconductor memory device of claim 2, wherein the second verification is performed before the first verification, and the control logic is configured to control the voltage generator to cause the semiconductor memory device to determine, in response to applying the first correction voltage, whether respective threshold voltages of the memory cells of the first memory cell group are equal to or greater than the first verification voltage, apply a third correction voltage to the first word line connected to one or more third memory cells of the first memory cell group based on a determination that the one or more third memory cells have respective threshold voltages smaller than the first verification voltage, the third correction voltage greater than the first correction voltage, determine, in response to applying the second correction voltage, whether respective threshold voltages of the memory cells of the first memory cell group are equal to or smaller than the second verification voltage, and apply a fourth correction voltage to the first word line connected to one or more fourth memory cells of the first memory cell group based on a determination that the one or more fourth memory cells have respective threshold voltages greater than the second verification voltage, the fourth correction voltage smaller than the second correction voltage.

6. The semiconductor memory device of claim 1, wherein an absolute value of the second correction voltage is equal to or smaller than an absolute value of the first correction voltage.

7. The semiconductor memory device of claim 1, wherein the control logic is configured to control the voltage generator to cause the semiconductor memory device to apply an inhibit voltage to a bit line connected to the first memory cell group, apply a second program voltage to the first word line such that the second memory cell group has a second threshold voltage, the second program voltage is a positive (+) second program voltage, determine whether respective threshold voltages of memory cells of the second memory cell group are equal to or greater than a third verification voltage, the third verification voltage smaller than the second threshold voltage, apply a third correction voltage to one or more third memory cells of the second memory cell group to perform a third verification based on a determination that the one or more third memory cells have respective threshold voltages smaller than the third verification voltage, the third correction voltage is a positive (+) third correction voltage, determine whether respective threshold voltages of the memory cells of the second memory cell group are equal to or smaller than a fourth verification voltage, the fourth verification voltage greater than the second threshold voltage, and apply a fourth correction voltage to the first word line connected to one or more fourth memory cells of the second memory cell group to perform a fourth verification based on a determination that the one or more fourth memory cells have respective threshold voltages greater than the fourth verification voltage, the fourth correction voltage is a negative (−) fourth correction voltage.

8. The semiconductor memory device of claim 7, wherein the second threshold voltage is greater than the first threshold voltage.

9. The semiconductor memory device of claim 8, wherein the first verification voltage and the second verification voltage are smaller than the second threshold voltage.

10. The semiconductor memory device of claim 1, wherein the memory cell array further includes a channel structure that extends in a third direction intersecting the first direction and the second direction, and the channel structure includes a data storage pattern including ferroelectrics.

11. A programming method of a semiconductor memory device, the semiconductor memory device including a substrate, the semiconductor memory device including a memory cell array which includes a plurality of memory cells, each memory cell configured to store a plurality of bits, a plurality of word lines connected to the plurality of memory cells and extending in a first direction on the substrate, and a plurality of bit lines connected to the plurality of memory cells and extending in a second direction intersecting the first direction, the semiconductor memory device including a voltage generator configured to generate a voltage applied to the memory cell array, the semiconductor memory device including a control logic configured to control the voltage generator, the word lines including a first word line, the plurality of memory cells including a first memory cell group, the first word line connected to the first memory cell group, the programming method comprising:

applying an erase voltage to the substrate to perform an erase operation on the plurality of memory cells corresponding to the plurality of word lines, the erase voltage is a positive (+) erase voltage;

subsequently to performing the erase operation, performing a first program operation, the first program operation including applying a first program voltage to the first word line so that the first memory cell group has a first threshold voltage, the first program voltage is a positive (+) first program voltage;

subsequently to performing the first program operation, performing a first verification operation on the first memory cell group based on a first verification voltage, the first verification voltage smaller than the first threshold voltage; and performing a second verification operation on the first memory cell group based on a second verification voltage, the second verification voltage greater than the first threshold voltage.

12. The programming method of claim 11, wherein the plurality of memory cells further includes a second memory cell group connected to the first word line, and the programming method further includes applying an inhibit voltage to a bit line connected to the second memory cell group so that the second memory cell group is not programmed in response to the first program voltage being applied to the first word line so that the first memory cell group has the first threshold voltage.

13. The programming method of claim 11, wherein the performing of the first verification operation includes determining whether respective threshold voltages of memory cells of the first memory cell group are equal to or greater than the first verification voltage, and applying a first correction voltage to the first word line connected to one or more first memory cells of the first memory cell group to perform a first verification based on a determination that the one or more first memory cells have respective threshold voltages smaller than the first verification voltage, the first correction voltage is a positive (+) first correction voltage, and the performing of the second verification operation includes determining whether respective threshold voltages of the memory cells of the first memory cell group are equal to or smaller than the second verification voltage, and applying a second correction voltage to the first word line connected to one or more second memory cells of the first memory cell group to perform a second verification based on a determination that the one or more second memory cells have respective threshold voltages greater than the second verification voltage, the second correction voltage is a negative (−) second correction voltage.

14. The programming method of claim 13, wherein the performing of the first verification operation includes determining, in response to applying the first correction voltage, whether respective threshold voltages of the memory cells of the first memory cell group are equal to or greater than the first verification voltage, and applying a third correction voltage to the first word line connected to one or more third memory cells of the first memory cell group based on a determination that the one or more third memory cells have respective threshold voltages smaller than the first verification voltage, the third correction voltage greater than the first correction voltage, and the performing of the second verification operation includes determining, in response to applying the second correction voltage, whether respective threshold voltages of the memory cells of the first memory cell group are equal to or smaller than the second verification voltage, and applying a fourth correction voltage to the first word line connected to one or more fourth memory cells of the first memory cell group based on a determination that the one or more fourth memory cells have respective threshold voltages greater than the second verification voltage, the fourth correction voltage smaller than the second correction voltage.

15. The programming method of claim 14, wherein the third correction voltage is greater than the first correction voltage by 0.2 to 0.3V, and the second correction voltage is greater than the fourth correction voltage by 0.2 to 0.3V.

16. The programming method of claim 13, wherein an absolute value of the second correction voltage is smaller than an absolute value of the erase voltage, and the absolute value of the second correction voltage is equal to or smaller than an absolute value of the first correction voltage.

17. The programming method of claim 11, wherein the plurality of memory cells further includes a second memory cell group connected to the first word line, the programming method further includes subsequently to performing the first verification operation, applying an inhibit voltage to a bit line connected to the first memory cell group;

performing a second program operation, the second program operation including applying a second program voltage to the first word line so that the second memory cell group has a second threshold voltage, the second program voltage is a positive (+) second program voltage;

subsequently to performing the second program operation, performing a third verification operation on the second memory cell group based on a third verification voltage, the third verification voltage smaller than the second threshold voltage; and performing a fourth verification operation on the second memory cell group based on a fourth verification voltage, the fourth verification voltage greater than the second threshold voltage, the performing of the third verification operation includes determining whether respective threshold voltages of memory cells of the second memory cell group are equal to or greater than the third verification voltage, and applying a third correction voltage to one or more third memory cells of the second memory cell group to perform a third verification based on a determination that the one or more third memory cells have respective threshold voltages smaller than the third verification voltage, the third correction voltage is a positive (+) third correction voltage, and the performing of the fourth verification operation further includes determining whether respective threshold voltages of the memory cells of the second memory cell group are equal to or smaller than the fourth verification voltage, the fourth verification voltage greater than the second threshold voltage, and applying a fourth correction voltage to the first word line connected to one or more fourth memory cells of the second memory cell group to perform a fourth verification based on a determination that the one or more fourth memory cells have respective threshold voltages greater than the fourth verification voltage, the fourth correction voltage is a negative (−) fourth correction voltage.

18. A programming method of a semiconductor memory device which includes a plurality of memory cells, a plurality of word lines connected to the plurality of memory cells and extending in a first direction on a substrate, a plurality of bit lines connected to the plurality of memory cells and extending in a second direction intersecting the first direction, and a control logic, the programming method comprising:

applying an erase voltage to the substrate to perform an erase operation on the plurality of memory cells, the erase voltage is a positive (+) erase voltage;

selecting a first word line among the plurality of word lines, the first word line connected to a first memory cell group and a second memory cell group among the plurality of memory cells;

applying a first program voltage to the first word line so that the first memory cell group has a first threshold voltage, applying a bit line program voltage to a first bit line connected to the first memory cell group, and applying an inhibit voltage to a second bit line connected to the second memory cell group, the first program voltage is a positive (+) first program voltage;

applying a first verification voltage to the first word line, the first verification voltage smaller than the first threshold voltage;

applying a first correction voltage to the first word line, the first correction voltage is a positive (+) first correction voltage, the first correction voltage greater than the first program voltage;

applying a second verification voltage to the first word line, the second verification voltage greater than the first threshold voltage;

applying a second correction voltage to the first word line, the second correction voltage is a negative (−) second correction voltage, an absolute value of the second correction voltage equal to or smaller than an absolute value of the first correction voltage;

applying a second program voltage to the first word line so that the second memory cell group has a second threshold voltage, applying the inhibit voltage to the first bit line, and applying the bit line program voltage to the second bit line, the second program voltage is a positive (+) second program voltage, the second threshold voltage greater than the first threshold voltage;

applying a third verification voltage to the first word line, the third verification voltage smaller than the second threshold voltage;

applying a third correction voltage to the first word line, the third correction voltage is a positive (+) third correction voltage, the third correction voltage greater than the second program voltage;

applying a fourth verification voltage to the first word line, the fourth verification voltage greater than the second threshold voltage; and applying a fourth correction voltage to the first word line, the fourth correction voltage is a negative (−) fourth correction voltage, an absolute value of the fourth correction voltage equal to or smaller than an absolute value of the third correction voltage.

19. The programming method of claim 18, further comprising:

subsequently to applying the first correction voltage to the first word line, re-applying the first verification voltage to the first word line to check whether respective threshold voltages of memory cells included in the first memory cell group are equal to or greater than the first verification voltage; and applying the second verification voltage to the first word line in response to a determination that the respective threshold voltages of all of the memory cells included in the first memory cell group are equal to or greater than the first verification voltage.

20. The programming method of claim 18, further comprising:

subsequently to applying the second correction voltage to the first word line, re-applying the second verification voltage to the first word line to check whether respective threshold voltages of memory cells included in the first memory cell group are equal to or smaller than the second verification voltage; and applying the first verification voltage to the first word line in response to a determination that the respective threshold voltages of all of the memory cells included in the first memory cell group are equal to or smaller than the second verification voltage.

* * * * *